United States Patent
Fusayasu et al.

(10) Patent No.: US 7,741,876 B2
(45) Date of Patent: Jun. 22, 2010

(54) DIFFERENTIAL TRANSMISSION LINE

(75) Inventors: Hirotsugu Fusayasu, Kyoto (JP); Seiji Hamada, Osaka (JP); Shinichi Tanimoto, Kyoto (JP); Ryo Matsubara, Osaka (JP)

(73) Assignee: Panasonic Corporation, Osaka (JP)

( * ) Notice: Subject to any disclaimer, the term of this patent is extended or adjusted under 35 U.S.C. 154(b) by 285 days.

(21) Appl. No.: 12/108,739

(22) Filed: Apr. 24, 2008

(65) Prior Publication Data

US 2008/0266019 A1 Oct. 30, 2008

(30) Foreign Application Priority Data

Apr. 24, 2007 (JP) ............................. 2007-113867
May 25, 2007 (JP) ............................. 2007-138741

(51) Int. Cl.
H03K 19/094 (2006.01)
H03K 19/0175 (2006.01)

(52) U.S. Cl. ............................. 326/86; 326/90; 326/101

(58) Field of Classification Search ....................... None
See application file for complete search history.

(56) References Cited

U.S. PATENT DOCUMENTS 6,556,628 B1 * 4/2003 Poulton et al. .............. 375/257

2007/0241836 A1 * 10/2007 Miller ........................ 333/1

FOREIGN PATENT DOCUMENTS

JP 2001-267701 9/2001
JP 3507687 12/2003

* cited by examiner

*Primary Examiner*—Anh Q Tran
(74) *Attorney, Agent, or Firm*—Wenderoth, Lind & Ponack, L.L.P.

(57) ABSTRACT

A differential transmission line that has three or more signal lines and with which there is little unwanted radiation noise is provided. The differential transmission line 2 is provided with three signal lines 2a, 2b, and 2c that transmit differential signals from a differential driver IC1 to a differential receiver IC3, and the majority of the signal lines 2a, 2b, and 2c is provided in conductor layers T2 and T3 of a printed circuit board 4. The signal lines 2a, 2b, and 2c are provided with a signal line parallel segment, a signal line route length adjustment segment that is on the differential driver IC1 side and that connects from differential signal output terminals 1Ea, 1Eb, and 1Ec in the differential driver IC1 to the signal line parallel segment, and a signal line route length adjustment segment that is on the differential receiver IC3 side and that connects from the signal line parallel segment to differential signal input terminals in the differential receiver IC3, wherein the signal lines 2a, 2b, and 2c are formed such that their signal line route length adjustment segments on the differential driver IC1 side are equal in length to one another.

19 Claims, 33 Drawing Sheets

| B1 | B2 | B3 | Vs1[V] | Vs2[V] | Vs3[V] |
|---|---|---|---|---|---|
| 0 | 0 | 0 | 0 | 0 | 0 |
| 0 | 0 | 1 | -1 | 0 | 1 |
| 0 | 1 | 0 | 0 | 1 | -1 |
| 0 | 1 | 1 | -1 | 1 | 0 |
| 1 | 0 | 0 | 1 | -1 | 0 |
| 1 | 0 | 1 | 0 | -1 | 1 |
| 1 | 1 | 0 | 1 | 0 | -1 |
| 1 | 1 | 1 | 0 | 0 | 0 |

*Fig. 16*

| B1 | B2 | B3 | polarity of V1 | polarity of V2 | polarity of V3 |
|---|---|---|---|---|---|
| 0 | 0 | 1 | − | − | + |
| 0 | 1 | 0 | − | + | − |
| 0 | 1 | 1 | − | + | + |
| 1 | 0 | 0 | + | − | − |
| 1 | 0 | 1 | + | − | + |
| 1 | 1 | 0 | + | + | − |

Fig. 18

| B1 | B2 | B3 | Vs1[V] | Vs2[V] | Vs3[V] | V1[V] | V2[V] | V3[V] | polarity of V1 | polarity of V2 | polarity of V3 |
|---|---|---|---|---|---|---|---|---|---|---|---|
| 0 | 0 | 0 | 0.25 | 0 | -0.25 | 0.25 | 0.25 | -0.5 | + | + | − |
| 0 | 0 | 1 | -1.25 | 0 | 1.25 | -1.25 | -1.25 | 2.5 | − | − | + |
| 0 | 1 | 0 | 0.25 | 1 | -1.25 | -0.75 | 2.25 | -1.5 | − | + | − |
| 0 | 1 | 1 | -1.25 | 1 | 0.25 | -2.25 | 0.75 | 1.5 | − | + | + |
| 1 | 0 | 0 | 1.25 | -1 | -0.25 | 2.25 | -0.75 | -1.5 | + | − | − |
| 1 | 0 | 1 | -0.25 | -1 | 1.25 | 0.75 | -2.25 | 1.5 | + | − | + |
| 1 | 1 | 0 | 1.25 | 0 | -1.25 | 1.25 | 1.25 | -2.5 | + | + | − |
| 1 | 1 | 1 | -0.25 | 0 | 0.25 | -0.25 | -0.25 | 0.5 | − | − | + |

*Fig. 23*

| B1 | B2 | B3 | Vs1[V] | Vs2[V] | Vs3[V] | V1[V] | V2[V] | V3[V] | polarity of V1 | polarity of V2 | polarity of V3 |
|---|---|---|---|---|---|---|---|---|---|---|---|
| 0 | 0 | 0 | -0.1 | 0 | 0.1 | -0.1 | -0.1 | 0.2 | − | − | + |
| 0 | 0 | 1 | -0.9 | 0 | 0.9 | -0.9 | -0.9 | 1.8 | − | − | + |
| 0 | 1 | 0 | -0.1 | 1 | -0.9 | -1.1 | 1.9 | -0.8 | − | + | − |
| 0 | 1 | 1 | -0.9 | 1 | -0.1 | -1.9 | 1.1 | 0.8 | − | + | + |
| 1 | 0 | 0 | 0.9 | -1 | 0.1 | 1.9 | -1.1 | -0.8 | + | − | − |
| 1 | 0 | 1 | 0.1 | -1 | 0.9 | 1.1 | -1.9 | 0.8 | + | − | + |
| 1 | 1 | 0 | 0.9 | 0 | -0.9 | 0.9 | 0.9 | -1.8 | + | + | − |
| 1 | 1 | 1 | 0.1 | 0 | -0.1 | 0.1 | 0.1 | -0.2 | + | + | − |

*Fig. 27*

DIFFERENTIAL TRANSMISSION LINE

BACKGROUND OF THE INVENTION

1. Field of the Invention

The present invention relates to differential transmission lines for transmitting signals at high speeds via a cable or the wiring pattern on a printed circuit board, for example, and in particular, relates to differential transmission lines adapted for issues with electro magnetic compatibility (hereinafter EMC) for preventing unwanted radiation noise from occurring.

2. Description of the Related Art

Single-end signals that oscillate with a logical amplitude at the power source voltage have conventionally been used for the transmission of high-speed signals, but the use of low voltage differential signaling (LVDS) has been on the rise in light of the increase in the number of drive frequencies and larger bus widths in conjunction with the recent demand for high-speed data transmission, as well as because of its inhibition of unwanted radiation noise and resistance against exogenous noise. With LVDS, generally the differential driver IC (or LSI) is designed such that only a reverse-phase differential mode current flows between the two transmission lines through which the differential signal flows.

FIG. 30 is a circuit diagram of the differential transmission circuit according to a first conventional technology, and FIG. 31 is a perspective view showing the schematic configuration of the differential transmission circuit of FIG. 30. The differential transmission circuit of FIG. 30 is an example of a conventional LVDS interface configuration. A differential driver IC911 and a differential receiver IC913 are connected by a differential transmission line 912, which is made from a positive signal line 912a and a negative signal line 912b, and a bit information signal that is input to the differential driver IC911 is transferred to the differential receiver IC913 via the differential transmission line 912 and then output. The positive output terminal of the differential driver IC911 (in FIG. 30, represented by point p1) is connected to the positive input terminal of the differential receiver IC913 via the signal line 912a, and similarly, the negative output terminal of the differential driver IC911 (in FIG. 30, represented by point p2) is connected to the negative input terminal of the differential receiver IC913 via the signal line 912b. To terminate the differential transmission line 912, the point p3 where it approaches the differential receiver IC913 on the signal line 912a and the point p4 where it approaches the differential receiver IC913 on the signal line 912b are connected by a 100-Ω terminal resistor. The differential transmission line 912 has a 50-Ω odd mode impedance. The positive signal line 912a and the negative signal line 912b of the differential transmission line 912 have equal electrical properties and form equivalent transmission routes, and in LVDS these two signal lines 912a and 912b together effect the transmission of a single bit information signal. Based on the bit information signal that is input from its input terminal, the differential driver IC911 creates a differential signal that causes a potential difference between the positive and negative sides of the differential transmission line 912. More specifically, the differential driver IC911 drives an approximately 3.5 mA current in order to generate an approximately 350 mV voltage between points p3 and p4 at either end of the 100-Ω terminal resistor R. The differential receiver IC913 detects the approximately 350 mV differential signal that is produced between points p3 and p4 at either end of the terminal resistor R and converts this to a CMOS level (a voltage level about 20 to 40% of the power source voltage; same hereinafter) and outputs the converted bit information signal from the output terminal.

As illustrated by FIG. 31, the differential transmission line of FIG. 30 is provided on a printed circuit board 914. The printed circuit board 914 can be made from a multilayer board provided with a plurality of conductor layers T11, T12, T13, and T14, and a plurality of dielectric layers D11, D12, and D13. The differential transmission line 912 is formed by processing, such as etching, the conducting material that has been laminated as the conductor layer T11.

In LVDS, the signal currents Is that flow through the positive signal line 912a and the negative signal line 912b of the differential transmission line 912 are the same size and are in opposite directions, and thus unwanted radiation noise and crosstalk noise are kept from occurring due to the fact that the magnetic fields that are produced by these moving currents cancel each other out, and also because the signal level is small. With regard to exogenous noise also, as long as the positive and negative sides of the differential transmission line 912 are affected relatively similarly, then there is no effect on the logic value of the signal, and thus LVDS has excellent noise resistance as well. However, the flow of a tiny in-phase common mode current to the differential transmission line 912 occurs in LVDS, due to differential impedance mismatching in the differential transmission line, such as the printed circuit board or the cable, or the end terminal circuit, and skewing between the signal lines 912a and 912b of the differential transmission line 912. In the differential transmission line 912 in FIG. 30, the differential mode current component is matched by the terminal resistor R and terminated, but there is no route for the common mode current component to flow over the circuit, and it returns via stray capacitance on the printed circuit board 914, for example. Thus, the common mode current component that is generated in the differential transmission line 912 was the primary source of unwanted radiation noise that radiates from LVDS transmission systems. In order to solve this issue, the two signal lines 912a and 912b are laid out parallel to and near one another as shown in FIG. 31, preventing differential impedance mismatch (for example, see Japanese Laid-Open Patent Publication No. 2001-267701). With this method, the common mode current that flows to the differential transmission line 912, which is made from the two signal lines 912a and 912b, is inhibited, allowing transmission noise and unwanted radiation noise to be inhibited.

However, compared to ordinary single-end transmission, the differential transmission line of FIGS. 30 and 31 has the numerous above-described merits for high-speed transmission, but requires the two signal lines 912a and 912b in order to transmit a single data bit, and this leads to problems such as requiring a large number of signal lines in order to achieve multiple bit transmission and an increase in the wiring region on the printed circuit board 914. One method that has been conceived to solve this problem is the use of three signal lines, with one of the signal lines serving as a complementary data line, in order to achieve transmission of two data bits with three signal lines, which required four signal lines with conventional differential transmission (for example, see Japanese Patent No. 3507687).

FIG. 32 is a perspective view that schematically shows the configuration of the differential transmission circuit according to a second conventional technology, and FIG. 33 is a cross-sectional view showing a section taken vertically along the line C-C' in FIG. 32 viewed in the arrow direction. A differential driver IC911A and a differential receiver IC913A are connected by a differential transmission line 912A, which is made of three signal lines 912a, 912b, and 912c. A first bit information signal that is input to the differential driver IC911A is transmitted to the differential receiver IC913A over the signal lines 912a and 912b, and similarly, a second bit information signal that is input to the differential driver IC911A is transmitted to the differential receiver IC913A over the signal lines 912b and 912c. A terminal resistor for terminating the signal lines 912a and 912b, and a terminal resistor for terminating the signal lines 912b and 912c, are provided in the differential receiver IC913A. As shown in FIGS. 32 and 33, the difference in the distance and the differential impedance between the two adjacent signal lines 912a and 912b, and 912b and 912c, and the signal lines 912a and 912c on the sides, that occurs when the three signal lines 912a, 912b, and 912c are arranged parallel on the printed circuit board 914 creates a novel problem in that the electromagnetic fields do not cancel each other out, and unwanted radiation noise cannot be eliminated.

Further, providing the differential transmission line on a printed circuit board that is a multilayer board allows for a configuration in which the signal lines are disposed in a plurality of conductor layers of the printed circuit board. However, in this case, the distance from the layer on which the differential driver IC and the differential receiver IC are provided and the conductor layer on which a signal line is disposed is different for each signal line, and therefore the length of the route between the terminal of the differential driver IC and the terminal corresponding to the differential receiver IC differed for each signal line. This created a new problem in that the difference in the signal line route length does not allow the balance between the signal lines to be maintained, and thus their electromagnetic fields cannot cancel each other out and as a result unwanted radiation noise cannot be reduced.

SUMMARY OF THE INVENTION

It is an object of the invention to solve the foregoing issues by providing a differential transmission line that has three or more signal lines and that has little unwanted radiation noise.

A differential transmission line according to the invention is a differential transmission line that is provided on a printed circuit board furnished with a plurality of laminated conductor layers, and that is furnished with at least three signal lines that transmit a differential signal from a driver unit on the printed circuit board to a receiver unit on the printed circuit board, wherein the at least three signal lines are provided in at least two conductor layers of the plurality of conductor layers, and wherein the signal lines comprise:

(a) a signal line parallel segment in which the signal lines run parallel;

(b) a first signal line route length adjustment segment, connecting from a differential signal output terminal in the driver unit to the signal line parallel segment, for adjusting the length of the signal line; and (c) a second signal line route length adjustment segment, connecting from the signal line parallel segment to a differential signal input terminal in the receiver unit, for adjusting the length of the signal line; and wherein the signal lines are formed such that their first signal line route length adjustment segments are equal in length to one another.

In the above differential transmission line, the signal lines are formed such that they are equal in length to one another in the second signal line route length adjustment segment.

Further, in the above differential transmission line, the differential signal output terminals of the driver unit are disposed in the longitudinal direction of the signal lines such that the output terminal that is connected to the signal line that is provided in the conductor layer most removed from the driver unit is relatively closer from the receiver unit than the output terminals that are connected to the signal lines provided in other conductor layers.

In the above differential transmission line, the differential transmission line is provided with three signal lines;

first and second signal lines of the three signal lines are provided in the first conductor layer of the plurality of conductor layers, separated from one another by a predetermined first distance; and a third signal line of the three signal lines is provided in the second conductor layer of the plurality of conductor layers, separated from the first signal line and the second signal line by a predetermined second distance.

In the above differential transmission line, the driver unit is provided with three output terminals for differential signals; and the three output terminals are disposed parallel such that they are separated from one another by the predetermined same distance.

Further, in the above differential transmission line, at least some of the three signal lines are disposed parallel such that they are separated from one another by the predetermined same distance.

Further, the differential transmission line is provided with three signal lines;

the driver unit is provided with three output terminals for differential signals;

first and second signal lines of the three signal lines are provided in the first conductor layer of the plurality of conductor layers, separated from one another by a predetermined distance;

a third signal line of the three signal lines is provided in the second conductor layer of the plurality of conductor layers, separated from the first signal line and the second signal line by the predetermined distance; and the three output terminals are disposed parallel such that the distance between the first and the second conductor layers is equal to the distance to a center point between the output terminal that is connected to the third signal line and the output terminals that are connected to the first and the second signal lines.

In the differential transmission line, the conductor layers in which are formed the signal lines other than the signal line that is provided in the conductor layer that is farthest removed from the driver unit include signal line return portions for extending the length of the other signal lines.

Further, in the differential transmission line, the printed circuit board is provided with at least four laminated conductor layers;

two of the conductor layers are formed as ground conductors;

the signal lines are formed as pattern conductors in some of the at least two conductor layers that are not the ground conductors; and all of the signal lines are disposed sandwiched by the two ground conductors.

A differential transmission line according to the invention is a differential transmission line that is provided on a printed circuit board, and that is furnished with at least three signal lines that transmit a differential signal from a driver unit to a receiver unit, wherein the at least three signal lines are disposed parallel to one another; and wherein in a cross section that is perpendicular to a longitudinal direction of the differential transmission line, the at least three signal lines are disposed at a substantially equal spacing on a same circumference.

In a cross section that is perpendicular to the longitudinal direction of the differential transmission line, each pair of two adjacent signal lines, of the three signal lines, has a cross-sectional shape that is symmetrical with respect to a center line between that pair of signal lines.

In the above differential transmission line, each signal line has a circular cross-sectional shape.

In the above differential transmission line, the differential transmission line comprises three signal lines, and each signal line has a substantially equilateral triangular cross-sectional shape.

Further, in the above differential transmission line, the printed circuit board is a multilayer printed circuit board that includes at least four laminated conductor layers;

two of the conductor layers serve as ground conductors;

the signal lines are formed as pattern conductors in some of the at least two conductor layers that are not the ground conductors; and all of the signal lines are disposed sandwiched by the two ground conductors.

A differential transmission line according to the invention is a differential transmission line that is provided on a double-sided printed circuit board, and that is furnished with at least three signal lines that transmit a differential signal from a driver unit to a receiver unit, wherein one of the signal lines is formed as a strip conductor of a coplanar line in one of the conductor layers of the double-sided printed circuit board, and the other two signal lines are formed as strip conductors of a coplanar line in the other conductor layer of the double-sided printed circuit board;

wherein the three signal lines are disposed parallel to one another; and wherein in a cross section that is perpendicular to the longitudinal direction of the differential transmission line, the three signal lines are disposed located substantially at the apexes of an equilateral triangle.

A differential transmission line according to the invention is used in a multiple differential transmission system.

A differential transmission line according to the invention is used in a multiple differential transmission system that is provided with a signal transmitter and a signal receiver.

The signal transmitter is connected to the differential transmission line, which has first, second, and third signal lines, and is furnished with a first differential driver, a second differential driver, and a third differential driver. The first differential driver transmits a first output signal, and an inverted first output signal whose phase is inverted compared to the first output signal, in response to a first bit information signal. The second differential driver transmits a second output signal, and an inverted second output signal whose phase is inverted compared to the second output signal, in response to a second bit information signal. The third differential driver transmits a third output signal, and an inverted third output signal whose phase is inverted compared to the third output signal, in response to a third bit information signal. The signal transmitter synthesizes the first output signal and the inverted third output signal and outputs the result to the first signal line, synthesizes the second output signal and the inverted first output signal and outputs the result to the second signal line, and synthesizes the third output signal and the inverted second output signal and outputs the result to the third signal line. Further, an absolute value of a binary signal voltage of the first output signal and an absolute value of a binary signal voltage of the second output signal are identical, and an absolute value of a binary signal voltage of the third output signal and the absolute value of the binary signal voltage of the first output signal are different.

The signal receiver is connected to the differential transmission line, which has first, second, and third signal lines, and is provided with a first differential receiver, a second differential receiver, a third differential receiver, a comparison unit, and a control unit. The first differential receiver detects a polarity of a terminal voltage that occurs at a first terminal resistor that is connected between the first signal line and the second signal line, and outputs the result of this detection as the first bit information signal. The second differential receiver detects a polarity of a terminal voltage that occurs at a second terminal resistor that is connected between the second signal line and the third signal line, and outputs the result of this detection as the second bit information signal. The third differential receiver detects a polarity of a terminal voltage that occurs at a third terminal resistor that is connected between the third signal line and the first signal line, and outputs the result of this detection as the third bit information signal. The comparison unit is for determining whether or not the absolute value of the third terminal voltage that occurs at the third terminal resistor exceeds a predetermined threshold voltage. The control unit is for outputting the first, second, and third bit information signals that are output from the first, second, and third differential receivers, when the absolute value of the third terminal voltage exceeds the predetermined threshold voltage, and outputs a 0 or 1 for all of the first, second, and third bit information signals, based on the third bit information signal that is output from the third differential receiver, when the absolute value of the third terminal voltage does not exceed the predetermined threshold voltage. Further, the threshold voltage is set so that it is larger than the absolute value of the difference between the absolute value of the binary signal voltage of the first output signal and the absolute value of the binary signal voltage of the third output signal.

According to the invention, in a differential transmission line that has three or more signal lines, the signal lines are formed such that they are equal in length to one another in the signal line route length adjustment segment on the driver unit side, and thus it is possible to provide a differential transmission line in which there is little unwanted radiation noise.

BRIEF DESCRIPTION OF THE DRAWINGS

FIG. 16 is a diagram that shows the relationship between the bit information that is transferred, and the signal voltages Vs1, Vs2, and Vs3 of the transmitted signals that are transmitted by the signal lines 2a, 2b, and 2c of the signal transmission route (differential transmission line) 2, in the multiple differential transmission system of FIG. 13.

FIG. 18 is a diagram that shows the relationship between the bit information that is transmitted, and the polarity of the terminal voltages V1, V2, and V3 of the terminal resistors 41, 42, and 43 of the signal receiver 3, in the multiple differential transmission system of FIG. 13.

FIG. 23 is a diagram that shows the relationship between the bit information that is transmitted, the signal voltages Vs1, Vs2, and Vs3 of the transmitted signals that are transmitted over the signal lines 2a, 2b, and 2c, and the terminal voltages V1, V2 and V3, and their polarities, of the terminal resistors 41, 42, and 43 of the signal receiver 3A, in the multiple differential transmission system of FIG. 20.

FIG. 27 is a diagram that shows the relationship between the bit information that is transmitted, the signal voltages Vs1, Vs2, and Vs3 of the transmitted signals that are transmitted over the signal lines 2a, 2b, and 2c, and the terminal voltages V1, V2, and V3, and their polarities, of the terminal resistors 41, 42, and 43 of the signal receiver 3B, in a third multiple differential transmission system that includes the differential transmission line according to the first embodiment of the invention (uses the configuration of FIG. 20, differing only in the setting conditions).

DETAILED DESCRIPTION OF THE INVENTION

Embodiments of the invention are described below in reference to the drawings. It should be noted that in the various embodiments, identical structural components have been assigned the same reference numbers.

First Embodiment

Figure 1:
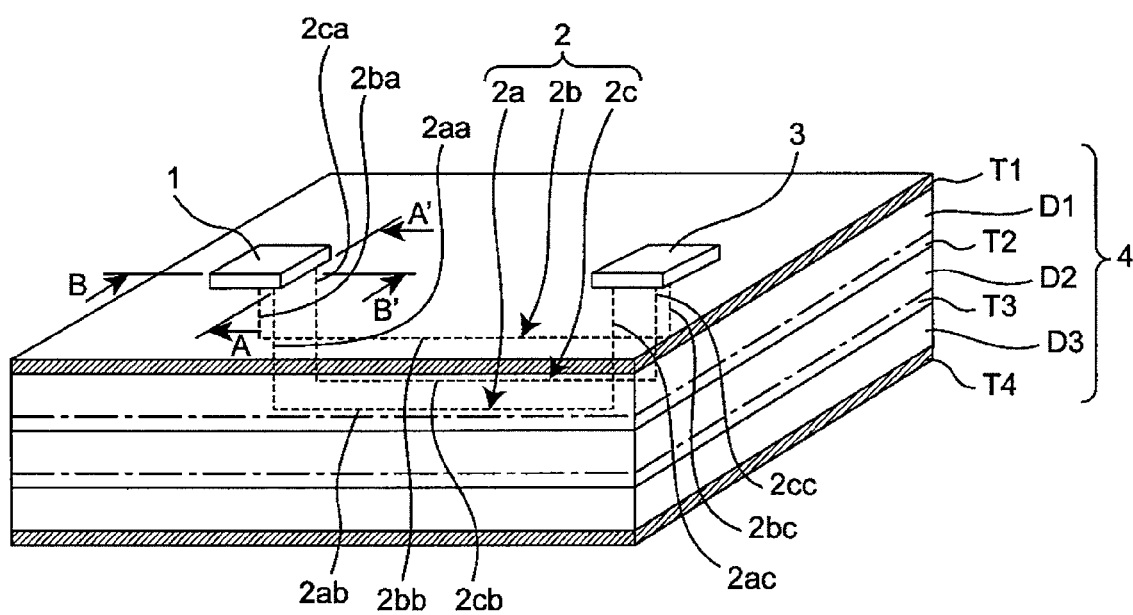
FIG. 1 is a perspective view that shows the schematic configuration of the differential transmission circuit, with some parts transparent, according to a first embodiment of the invention.
Figure 2:
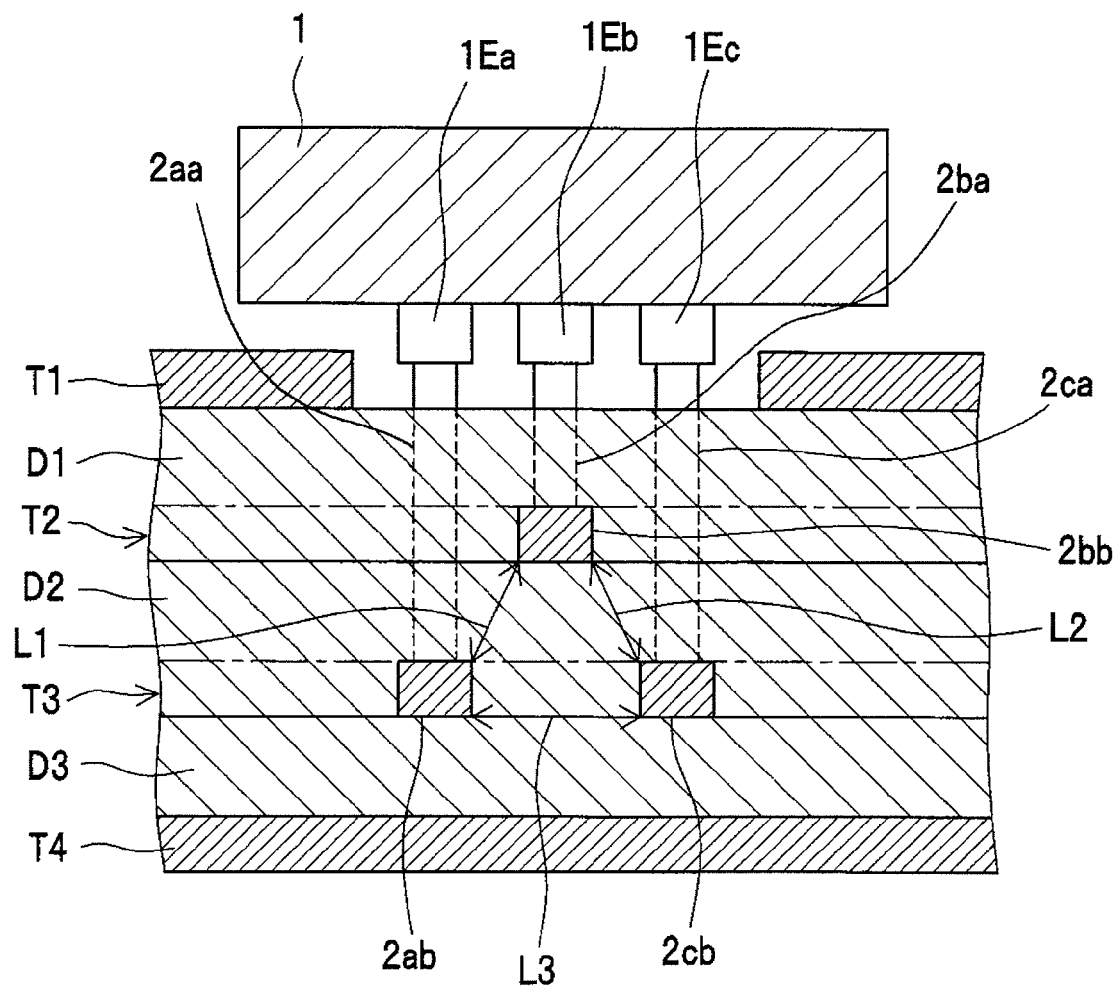
FIG. 2 is a cross-sectional view showing the section cut along the A-A' line in FIG. 1.
Figure 3:
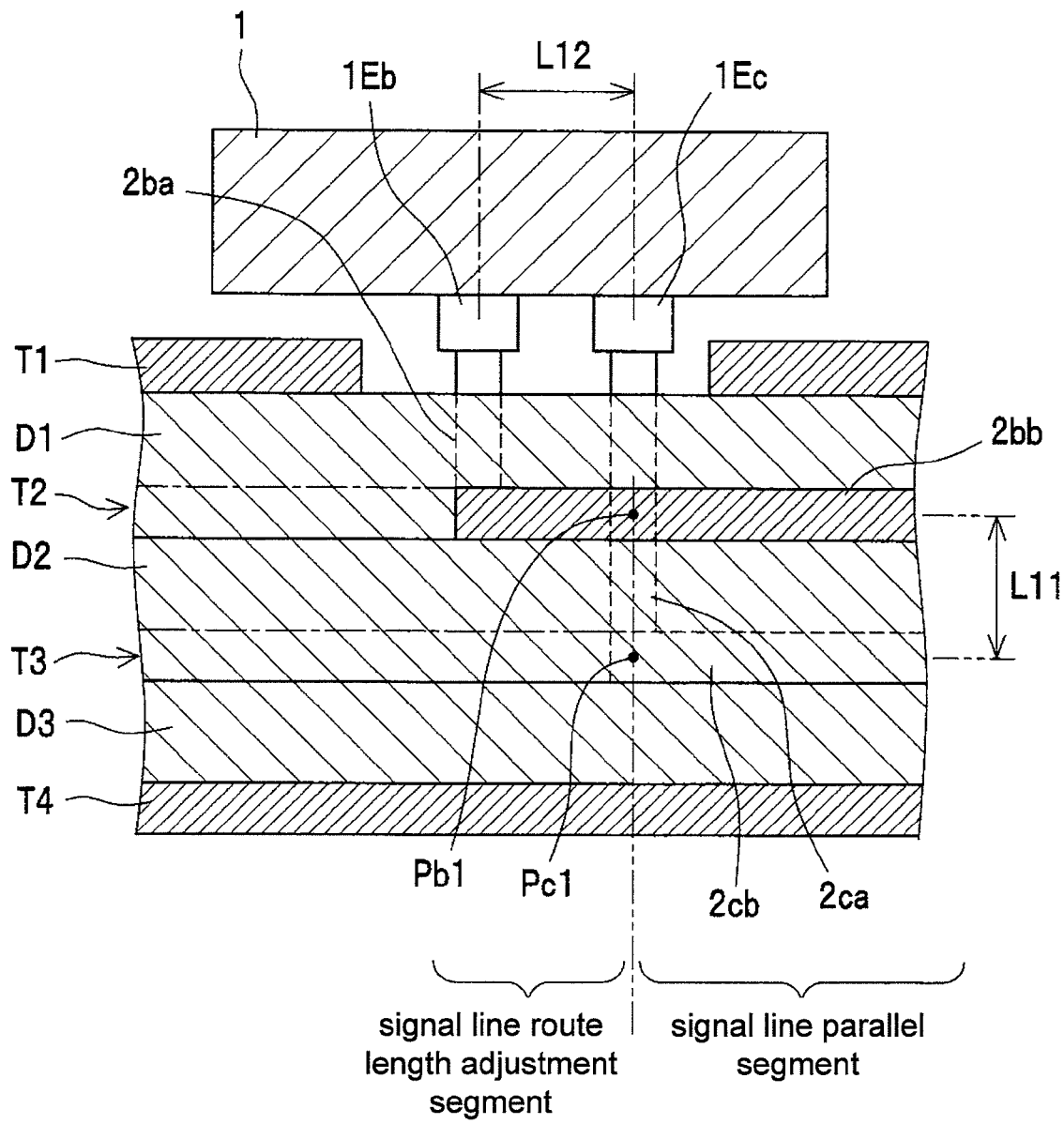
FIG. 3 is a cross-sectional view showing the section cut along the B-B' line in FIG. 1.

FIG. 1 is a perspective view that shows the schematic configuration of the differential transmission circuit, with some parts transparent, according to a first embodiment of the invention, FIG. 2 is a cross-sectional view showing the section taken vertically along the line A-A' in FIG. 1, viewed in the arrow direction, and FIG. 3 is a cross-sectional view showing the section taken vertically along the line B-B' in FIG. 1, viewed in the arrow direction. The differential transmission line of this embodiment is a differential transmission line 2 that is provided on a printed circuit board 4, which is provided with a plurality of laminated conductor layers T1, T2, T3, and T4, and is provided with three signal lines 2a, 2b, and 2c that transmit differential signals from a differential driver IC 1 on the printed circuit board 4 to a differential receiver IC3 on the printed circuit board 4, and is characterized in that the largest portion of the signal lines 2a, 2b, and 2c resides in the two conductors layers T2 and T3 of the plurality of conductor layers, and the signal lines 2a, 2b, and 2c are each provided with a signal line parallel segment in which the signal lines 2a, 2b, and 2c run parallel to one another, a signal line route length adjustment segment on the differential driver IC1 side that extends from differential signal output terminals 1Ea, 1Eb, and 1Ec in the differential driver IC1 up to the signal line parallel segment and that adjusts the route length of the signal lines 2a, 2b, and 2c, and a signal line route length adjustment segment on the differential receiver IC3 side that extends from the signal line parallel segment up to the differential signal input terminals in the differential receiver IC3 and that adjusts the route length of the signal lines 2a, 2b, and 2c, and moreover, the signal lines 2a, 2b, and 2c are formed such that their signal line route length adjustment segments on the differential driver IC1 side are equal in length. In this embodiment, in order to achieve this same-length configuration, the positions of the differential signal output terminals 1Ea, 1Eb, and 1Ec of the differential driver IC1 are adjusted (discussed in detail later).

The differential driver IC1 and the differential receiver IC3 are connected by the differential transmission line 2, which is made from the three signal lines 2a, 2b, and 2c, and the three bit information signals that are input to the differential driver IC1 are transmitted to the differential receiver IC3 via the differential transmission line 2 and then output. The internal structure of the differential driver IC1 and the differential receiver IC3, and the details of signal transmission, are described later with reference to FIG. 4. The differential driver IC1 and the differential receiver IC3 are located within the uppermost conductor layer T1 of the printed circuit board 4, which is a multilayer board, separated from each other by a predetermined distance. As shown in FIGS. 1 through 3, the printed circuit board 4 is made of four conductor layers T1, T2, T3, and T4 that are provided in that order from top to bottom and that allow circuit patterns and various circuit components to be furnished, a dielectric layer D1 between the conductor layers T1 and T2, a dielectric layer D2 between the conductor layers T2 and T3, and a dielectric layer D3 between the conductor layers T3 and T4. The signal lines 2a, 2b, and 2c are disposed over substantially the entire differential transmission line 2 in such a manner that the distance between any pair of signal lines is a predetermined value. In particular, the central segments, excluding the ends, of the signal lines 2a, 2b, and 2c have the following structure in order to achieve this configuration. The central segments of the signal lines 2a and 2c, and the center segment of the signal line 2b, are provided in different layers of the printed circuit board 4, and more specifically, in the configuration shown in FIGS. 1 through 3, the central segments of the signal lines 2a and 2c are disposed in the conductor layer T3, and the central segment of the signal line 2b is disposed in the conductor layer T2. Moreover, the central segments of the signal lines 2a and 2c are separated by a predetermined distance L3, and the central segment of the signal line 2b is separated from the central segments of the signal lines 2a and 2c by distances L1, and L2, respectively, which are identical to the distance L3. Thus, when looking at a cross-section perpendicular to the longitudinal direction of the central segments of the signal lines 2a, 2b, and 2c, as shown by FIG. 2 the signal lines 2a, 2b, and 2c are disposed at a substantially equal spacing (L1=L2=L3) on the same circumference and thus are located at the apexes of an equilateral triangle.

In this embodiment, the differential driver IC1 and the differential receiver IC3 are packaged as a BGA (ball grid array). As shown in FIGS. 2 and 3, in its bottom surface the differential driver IC1 is provided with three output terminals 1Ea, 1Eb, and 1Ec that correspond to the three signal lines 2a, 2b, and 2c, and of these output terminals 1Ea, 1Eb, and 1Ec, the output terminal 1Eb is provided farther from the differential receiver IC3 than the output terminals 1Ea and 1Ec. In this embodiment, the output terminals 1Ea and 1Ec are separated by the same distance as the distance between the signal lines 2a and 2c, and the output terminal 1Eb is away from the output terminals 1Ea and 1Ec by the same distance as this distance. In this way, the output terminals 1Ea, 1Eb, and 1Ec are provided at the apexes of an equilateral triangle like in the section perpendicular to the longitudinal direction of the central segments of the signal lines 2a, 2b, and 2c. The bit information signal input terminals and other terminals, such as the power source terminal, in the differential driver IC1 have been omitted in order to simplify the drawings. Likewise, the differential receiver IC3 in its bottom surface it is provided with three input terminals that correspond to the three signal lines 2a, 2b, and 2c (not shown), and of these input terminals, the input terminal that corresponds to the signal line 2b is provided farther from the differential driver IC1 than the input terminals that correspond to the signal lines 2a and 2c. In this embodiment, these input terminals, like the output terminals of the differential driver IC1, are provided located at the apexes of an equilateral triangle.

In this embodiment, each of the signal lines 2a, 2b, and 2c is made by combining a through hole conductor and a pattern conductor. More specifically, the parts of the signal lines 2a, 2b, and 2c that are connected to the three output terminals 1Ea, 1Eb, and 1Ec of the differential driver IC1 are formed by through hole conductors 2aa, 2ba, and 2ca, and the through hole conductors 2aa and 2ca are provided such that they pass from the conductor layer T1 to the conductor layer T3 of the printed circuit board 4 (insulated from the conductor layers T1 and T2), and the through hole 2ba is provided such that it passes from the conductor layer T1 to the conductor layer T2 of the printed circuit board 4 (insulated from the conductor layer T1), and thus, the through hole conductors 2aa, 2ba, and 2ca electrically connect the three output terminals 1Ea, 1Eb, and 1Ec of the differential driver IC1 and the segments of the signal lines 2a, 2b, and 2c disposed in the conductor layers T2 or T3. Similarly, the parts of the signal lines 2a, 2b, and 2c that are connected to the three input terminals of the differential receiver IC3 are formed as through hole conductors 2ac, 2bc, and 2cc, and the through hole conductors 2ac and 2cc are provided such that they pass from the conductor layer T1 to the conductor layer T3 of the printed circuit board 4 (insulated from the conductor layers T1 and T2), and the through hole 2bc is provided such that it passes from the conductor layer T1 to the conductor layer T2 of the printed circuit board 4 (insulated from the conductor layer T1), and thus, the through hole conductors 2ac, 2bc, and 2cc electrically connect the segments of the signal lines 2a, 2b, and 2c that are disposed in the conductor layers T2 or T3, and the three input terminals of the differential receiver IC3. The central segments of the signal lines 2a and 2c are formed as pattern conductors 2ab and 2cb on the conductor layer T3, and the central segment of the signal line 2b is formed as a pattern conductor 2bb in the conductor T2. The pattern conductors 2ab and 2cb are formed by etching a conductor material (such as copper foil with a predetermined thickness (35 μm, for example)) that has been layered onto the dielectric layer D3 as the conductor layer T3, and similarly, the pattern conductor 2bb is formed by etching a conductor material that has been layered onto the dielectric layer D2 as the conductor layer T2. In this embodiment, all of the conductor material is removed from parts other than the pattern conductors 2ab and 2cb in the conductor layer T3 and is filled by a dielectric material, all of the conductor material is removed from parts other than the pattern conductor 2bb of the conductor layer T2 and filled by with a dielectric material, and the conductor layers T1 and T4 are formed as ground conductors and are disposed sandwiching from above and below the conductor layers T2 and T3 in which the pattern conductors 2ab, 2bb, and 2cb are formed.

As illustrated in FIG. 3, the signal lines 2a, 2b, and 2c according to this embodiment of the invention are characterized in that they are provided with a signal line parallel segment in which they are disposed near one another so that reverse phase differential signals are transmitted between adjacent signal lines, a signal line route length adjustment segment on the differential driver IC1 side for connecting the differential driver IC1 and the signal line parallel segment, and a signal line route length adjustment segment on the differential receiver IC3 side for connecting the signal line parallel segment and the differential receiver IC3 (not shown in FIG. 3). As shown in FIG. 3, the signal lines 2a, 2b, and 2c in the signal line route length adjustment segment on the differential driver IC1 side connect the end points of the signal line parallel segment on the differential driver IC1 side (in FIG. 3, the end point Pb1 of signal 2b in the signal line parallel segment and the end point Pc1 of signal 2c in the signal line parallel segment), and the output terminals 1Ea, 1Eb, and 1Ec of the differential driver IC1, with equal distance. To realize this, the distance L11 between the conductor layer T2 and T3, and the distance L12 from the input terminals 1Ea and 1Ec near the differential receiver IC3, which is substantially parallel to the signal line parallel segment, to the output terminal 1Eb far from the differential receiver IC3 (that is, the distance from the straight line that includes the output terminals 1Ea and 1Ec to the output terminal 1Eb), are equal. With this configuration, the distance from the output terminal 1Ea to the pattern conductor 2ab via the through hole conductor 2aa (that is, up to the end point of the signal line parallel segment of the signal line 2a on the differential driver IC1 side), the distance from the output terminal 1Eb to the point Pb1 on the pattern conductor 2ab via the through hole 2ba (that is, up to the end point of the signal line parallel segment of the signal line 2b on the differential driver IC1 side), and the distance from the output terminal 1Ec to the point Pc1 on the pattern conductor 2cb via the through hole 2ca (that is, up to the end point of the signal line parallel segment of the signal line 2c on the differential driver IC1 side), are equal to one another, and thus the balance between the signal lines 2a, 2b, and 2c in the signal line parallel segments is retained, and unwanted radiation noise on the differential transmission line 2 can be effectively reduced.

Similarly, the signal lines 2a, 2b, and 2c in the signal line route length adjustment segment on the differential receiver IC3 side connect the end points on the differential receiver IC3 side of the signal line parallel segment and the input terminals of the differential receiver IC3 with an equal distance. To realize this, the distance L11 between the conductor layer T2 and T3, and the distance from the input terminals near the differential driver IC1, which is substantially parallel to the signal line parallel segment, to the output terminal far from the differential driver IC1 (that is, the distance from the straight line that includes the input terminals connected to the signal lines 2a and 2c to the input terminal that is connected to the signal line 2b), are equal. With this configuration, the distance from the end point of the signal line parallel segment of the signal line 2a on the differential receiver IC3 side to the input terminal that is connected to the signal line 2a via the through hole conductor 2aa, the distance from the end point of the signal line parallel segment of the signal line 2b on the differential receiver IC3 side to the input terminal that is connected to the signal line 2b via the through hole conductor 2ba, and the distance from the end point of the signal line parallel segment of the signal line 2c on the differential receiver IC3 side to the input terminal that is connected to the signal line 2c via the through hole conductor 2ca, are equal to one another.

Thus, with the differential transmission line 2 of this embodiment, the differential signal output terminals 1Ea, 1Eb, and 1Ec of the differential driver circuit 1 are characterized in that they are disposed in the longitudinal direction of the signal lines 2a, 2b, and 2c such that the output terminals 1Ea and 1Ec connected to the signal lines 2a and 2c provided in the conductor layer T3, which are the farthest away from the differential driver circuit 1, are relatively closer from the differential receiver circuit 3 than the output terminal 1Eb, which is connected to the signal line 2b provided in the other conductor layer T2. By adjusting the locations of the differential signal output terminals 1Ea, 1Eb, and 1Ec of the differential driver IC1 in this way, the signal lines 2a, 2b, and 2c are formed at the same length in the signal line route length adjustment segment on the differential driver IC1 side, and thus it is possible to achieve a differential transmission line 2 in which there is little unwanted radiation noise.

<1.1: Method of Transmission for the Three Bit Information Signals>

Figure 4:
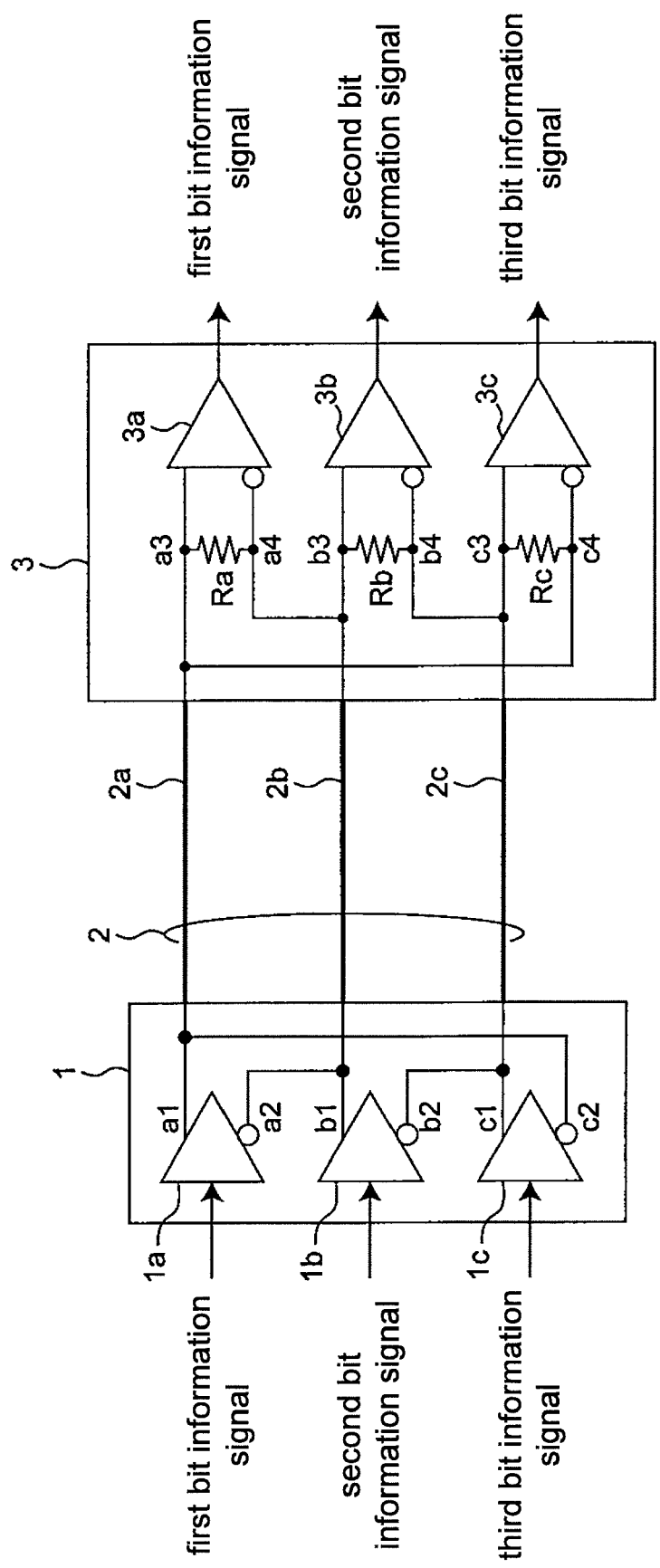
FIG. 4 is a circuit diagram of the differential transmission line of FIG. 1.

The method of transmitting the three bit information signals using the differential transmission line 2 is described in detail below using FIG. 4. FIG. 4 is a circuit diagram of the differential transmission circuit of FIG. 1. The differential driver IC1 is made of differential driver circuits 1a, 1b, and 1c, and the differential receiver IC3 is made of differential receiver circuits 3a, 3b, and 3c, which are differential amplifiers, and terminal resistors Ra, Rb, and Rc.

In the differential driver IC1, the positive output terminal a1 of the differential driver circuit 1a is connected to the signal line 2a and its negative output terminal a2 is connected to the signal line 2b, the positive output terminal b1 of the differential driver circuit 1b is connected to the signal line 2b and its negative output terminal b2 is connected to the signal line 2c, and the positive output terminal c1 of the differential driver circuit 1c is connected to the signal line 2c and its negative output terminal c2 is connected to the signal line 2a. The differential driver circuits 1a, 1b, and 1c each drive an approximately 3.5 mA current, and generate a differential signal in response to the bit information signal that arrives at the differential driver IC1. More specifically, the differential driver circuit 1a generates differential signals (that is, a signal with a predetermined amplitude, and its inverse signal) in response to a first bit information signal that arrives at the differential driver IC1 in order to produce a potential difference between the signal lines 2a and 2b. For example, when the bit information signal is 0, then the differential driver circuit 1a outputs a negative potential signal from the positive output terminal a1 and outputs a positive potential signal from the negative output terminal a2, whereas when the bit information signal is 1, the differential driver circuit 1a outputs a positive potential signal from the positive output terminal a1 and outputs a negative potential signal from the negative output terminal a2. Similarly, the differential driver circuit 1b generates differential signals in response to a second bit information signal that arrives at the differential driver IC1 in order to produce a potential difference between the signal lines 2b and 2c, and the differential driver circuit 1c generates differential signals in response to a third bit information signal that arrives at the differential driver IC1 in order to produce a potential difference between the signal lines 2c and 2a. The differential transmission line 2 has an odd mode impedance of 50Ω, for example, between the signal lines 2a, 2b, and 2c. The signal lines 2a, 2b, and 2c have equal electrical properties and form equivalent transmission routes, and these three signal lines 2a, 2b, and 2c together effect the transmission of three bit information signals. The differential receiver IC3 is provided with a terminal resistor Ra that terminates the pair of signal lines 2a and 2b, a terminal resistor Rb that terminates the pair of signal lines 2b and 2c, and a terminal resistor Rc that terminates the pair of signal lines 2c and 2a. The terminal resistors Ra, Rb, and Rc each have a 100Ψ resistance value, which is equivalent to the differential impedance, and an approximately +350 mV or an approximately −350 mV voltage is generated at each end of the terminal resistors Ra, Rb, and Rc in accordance with the direction of the approximately 3.5 mA current that is driven by the differential driver circuits 1a, 1b, and 1c. The differential receiver circuit 3a detects the positive or negative potential that occurs between the ends of the resistor Ra, and decodes the first bit information signal that was transmitted and converts the decoded first bit information signal to the CMOS level and outputs it. Similarly, the differential receiver circuit 3b detects the positive or negative potential that occurs between the ends of the resistor Rb, and decodes the second bit information signal that was transmitted and converts the decoded second bit information signal to the CMOS level and outputs it, and the differential receiver circuit 3c detects the positive or negative potential that occurs between the ends of the resistor Rc, and decodes the third bit information signal that was transmitted and converts the decoded third bit information signal to the CMOS level and outputs it.

When a bit information signal is transmitted over the differential transmission line 2, the differential receiver IC3 decodes the bit information signal prior to transmission as shown below.

Table 1 is a bit assignment table that shows the relationship between the bit information signals that are transmitted, and the potential (terminal potential) at the terminals on the side of the differential receiver circuits 3a, 3b, and 3c of the signal lines 2a, 2b, and 2c. The values of the terminal potentials have been normalized in order to simplify the description.

TABLE 1

| first bit information | second bit information | third bit information | terminal potential of signal line 2a | terminal potential of signal line 2b | terminal potential of signal line 2c |
|---|---|---|---|---|---|
| 0 | 0 | 0 | 0 | 0 | 0 |
| 0 | 0 | 1 | −1 | 0 | 1 |
| 0 | 1 | 0 | 0 | 1 | −1 |
| 0 | 1 | 1 | −1 | 1 | 0 |
| 1 | 0 | 0 | 1 | −1 | 0 |
| 1 | 0 | 1 | 0 | −1 | 1 |
| 1 | 1 | 0 | 1 | 0 | −1 |
| 1 | 1 | 1 | 0 | 0 | 0 |

Here, the terminal potentials of the signal lines 2a, 2b, and 2c are described. In one signal line, on its driver side, two voltage signals V1 and V2 that are generated by two differential driver circuits are superimposed and applied, and on its receiver side, the overall impedance Z of the receiver is charged. When r is the internal resistance of the signal line, the terminal potential V of the signal line is expressed by the following equation.

Eq. 1

$$V = \frac{V_1 + V_2}{r + 2Z} Z \tag{1}$$

Here, r can be regarded as significantly smaller than Z, and thus the equation can be approximated as follows.

Eq. 2

$$V = \frac{1}{2}(V_1 + V_2) \quad (2)$$

Table 2 shows the current direction at the terminal resistors Ra, Rb, and Rc.

TABLE 2

| first bit information | second bit information | third bit information | current direction at terminal resistor Ra | current direction at terminal resistor Rb | current direction at terminal resistor Rc |
|---|---|---|---|---|---|
| 0 | 0 | 1 | − | − | + |
| 0 | 1 | 0 | − | + | − |
| 0 | 1 | 1 | − | + | + |
| 1 | 0 | 0 | + | − | − |
| 1 | 0 | 1 | + | − | + |
| 1 | 1 | 0 | + | + | − |

In this way, the voltage that is applied to the signal lines 2a, 2b, and 2c of the differential transmission line 2 totals 0 regardless of the bit information signal that is transmitted, and noise that radiates from the signal lines 2a, 2b, and 2c cancels itself out, and thus transmission with little noise is possible.

<1.2: Multiple Differential Transmission System Including Differential Transmission Lines>

More specifically, here is described a multiple differential transmission system that includes the differential transmission line according to this embodiment of the invention.

<1.2.1: First Multiple Differential Transmission System>

Figure 13:
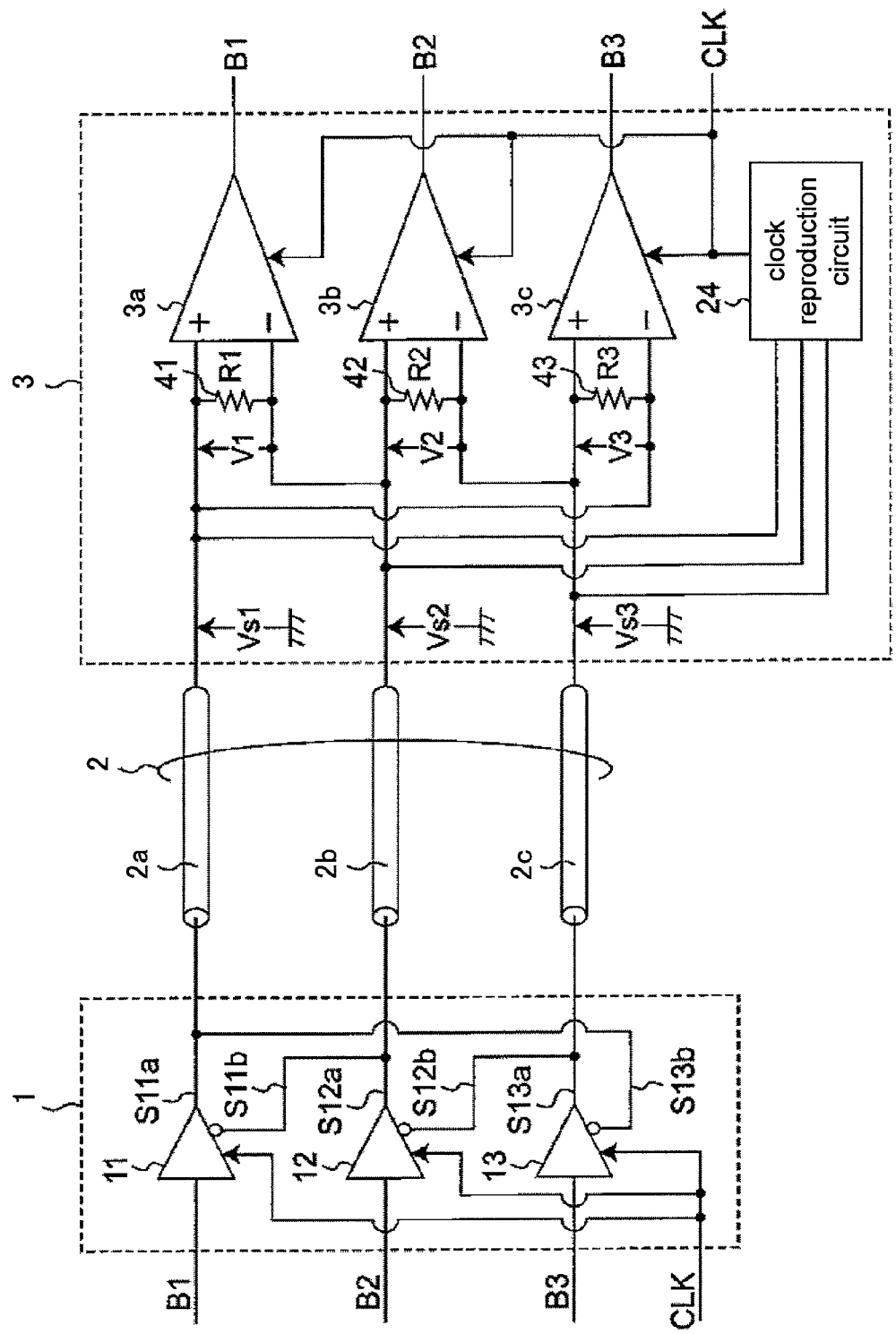
FIG. 13 is a block diagram showing the configuration of a first multiple differential transmission system that includes the differential transmission line according to the first embodiment of the invention.

FIG. 13 is a block diagram that shows the configuration of a first multiple differential transmission system that includes the differential transmission line according to this embodiment of the invention. In FIG. 13, the first multiple differential transmission system is made by connecting a signal transmitter (differential driver IC) 1 and a signal receiver (differential receiver IC) 3 via a signal transmission route (differential transmission line) 2. The signal transmitter 1 is provided with (a) a differential driver 1a that outputs a first output signal S11a and an inverted first output signal S11b, whose phase is inverted compared to the first output signal 11a, in response to a bit information signal B1, which is either high or low level, (b) a differential driver 1b that outputs a second output signal S12a and an inverted second output signal S12b, whose phase is inverted compared to the second output signal 12a, in response to a bit information signal B2, which is either high or low level, and (c) a differential driver 1c that outputs a third output signal S13a and an inverted third output signal S13b, whose phase is inverted compared to the third output signal 13a, in response to a bit information signal B3, which is either high or low level. The binary voltage level of each output signal is ±1 V and these are equal to one another, and the differential drivers 1a, 1b, and 1c operate so as to send the output signals in synchronization with the rise in the clock CLK.

The signal transmission route (differential transmission line) 2 is made of signal lines 2a, 2b, and 2c. Here, the first output signal S11a from the differential driver 1a and the inverted third output signal S13b from the differential driver 1c are synthesized and then delivered to the signal line 2a. The second output signal S12a from the differential driver 1b and the inverted first output signal S11b from the differential driver 1a are synthesized and then delivered to the signal line 2b. The third output signal S13a from the differential driver 1c and the inverted second output signal S12b from the differential driver 1b are synthesized and then delivered to the signal line 2c.

The signal receiver 3 is made of three individual differential receivers 3a, 3b, and 3c, each of which are bit information decision devices (as described later using FIG. 19, they are made from comparators that determine whether or not the terminal voltages V1, V2, and V3 are negative), a clock reproduction circuit 24, and three terminal resistors 41, 42, and 43. The terminal resistor 41 is connected between the signal line 2a and the signal line 2b, and the direction of the current that flows to the terminal resistor 41 or the polarity of the terminal voltage V1 that is generated in the terminal resistor 41 is detected by the differential receiver 3a. The terminal resistor 42 is connected between the signal line 2b and the signal line 2c, and the direction of the current that flows to the terminal resistor 42 or the polarity of the terminal voltage V2 that is generated in the terminal resistor 42 is detected by the differential receiver 3b. The terminal resistor 43 is connected between the signal line 2c and the signal line 2a, and the direction of the current that flows to the terminal resistor 43 or the polarity of the terminal voltage V3 that is generated in the terminal resistor 43 is detected by the differential receiver 3c. The clock reproduction circuit 24 includes a rise detection circuit and a PLL circuit, and produces a clock CLK that has a predetermined period in response to detection of the rising edge of the transmitted signal that is transmitted to the three signal lines 2a, 2b, and 2c, and outputs the clock CLK to the differential receivers 3a, 3b, and 3c. The differential receivers 3a, 3b, and 3c execute a decision regarding the bit information, as described later, in synchronization with the rise in the clock CLK that is input, and output bit information signals B1, B2, and B3, respectively.

Figure 14:
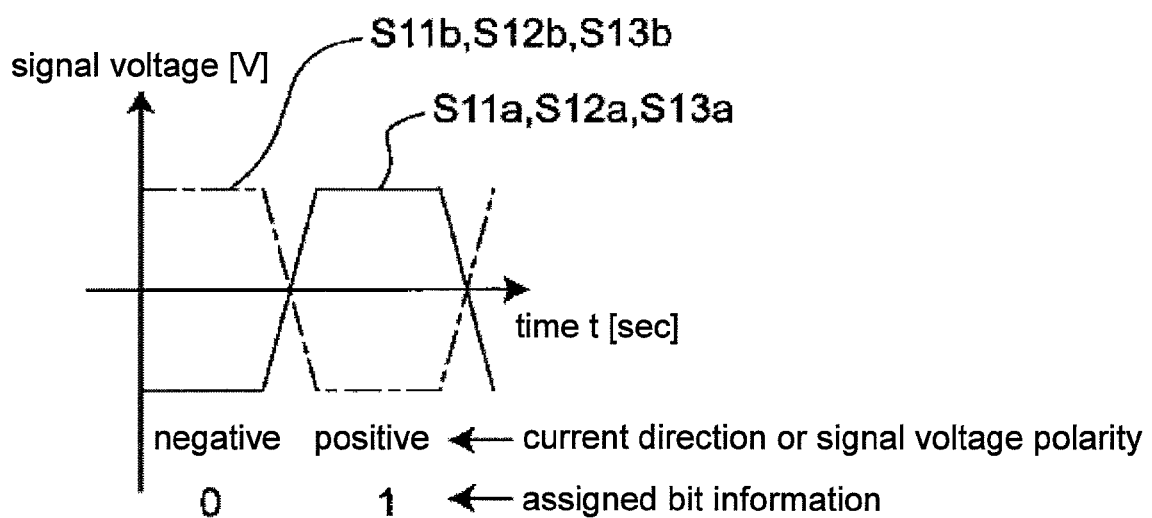
FIG. 14 is a waveform diagram that shows the relationship between the signal waveforms of the output signals S11a, S11b, S12a, S12b, S13a, and S13b of the differential drivers 1a, 1b, and 1c of FIG. 13, the definition of the current direction or the polarity of the signal voltage, and the assigned bit information.
Figure 15:
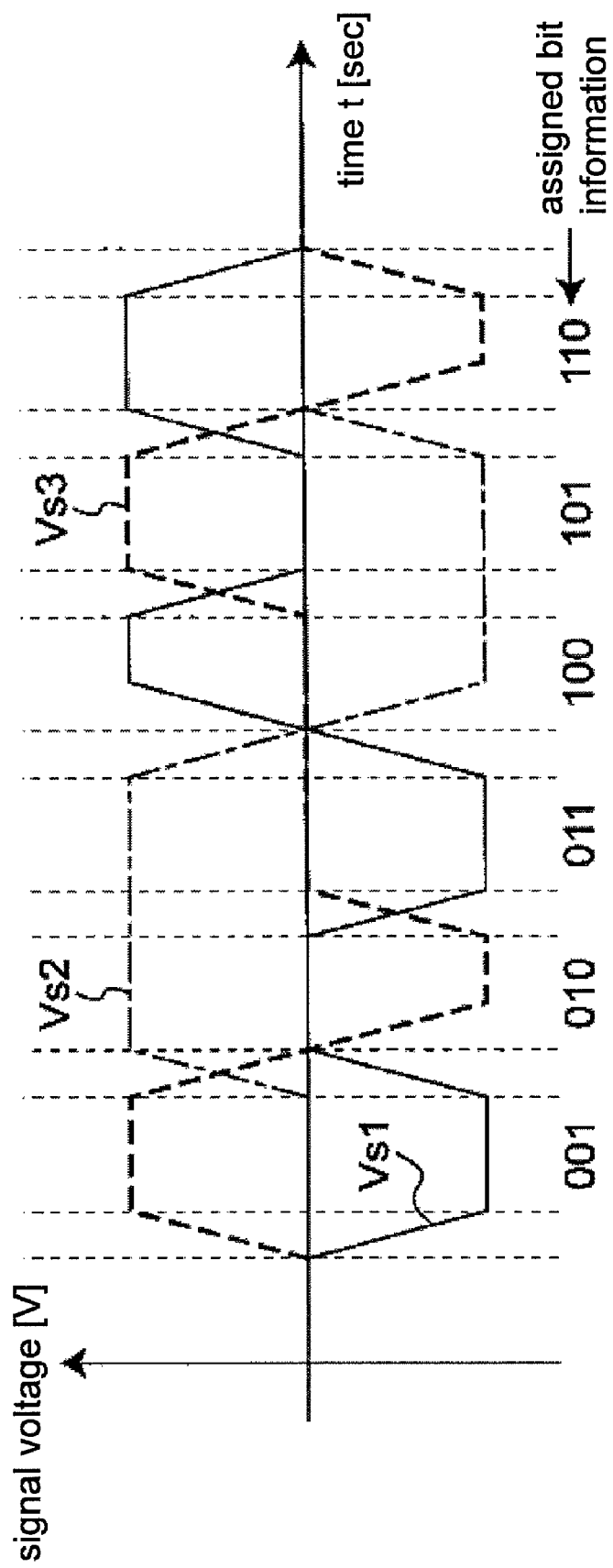
FIG. 15 is a waveform diagram that shows the relationship between the signal waveforms of the signal voltages Vs1, Vs2, and Vs3 of the transmitted signals that are transmitted via the signal lines 2a, 2b, and 2c of the signal transmission route (differential transmission line) 2 of FIG. 13, and the bit information that is assigned.

FIG. 14 is a waveform diagram that shows the relationship between the signal waveforms of the output signals S11a, S11b, S12a, S12b, S13a, and S13b of the differential drivers 1a, 1b, and 1c of FIG. 13, a definition of the current direction or the polarity of the signal voltage, and the assigned bit information, and FIG. 15 is a waveform diagram that shows the relationship between the signal waveforms of the signal voltages Vs1, Vs2, and Vs3 of the transmitted signals that are transmitted via the signal lines 2a, 2b, and 2c of the signal transmission route (differential transmission line) 2 of FIG. 13, and the bit information that is assigned. The differential receivers 3a, 3b, and 3c output the output signals shown in FIG. 14 in accordance with the bit information signals that are input, and, at this time, the signal voltages Vs1, Vs2, and Vs3 of the transmitted signals that are transmitted via the signal lines 2a, 2b, and 2c of the signal transmission route (differential transmission line) 2 in accordance with the three-bit bit information signals that are input are shown in FIG. 15.

Figure 17:
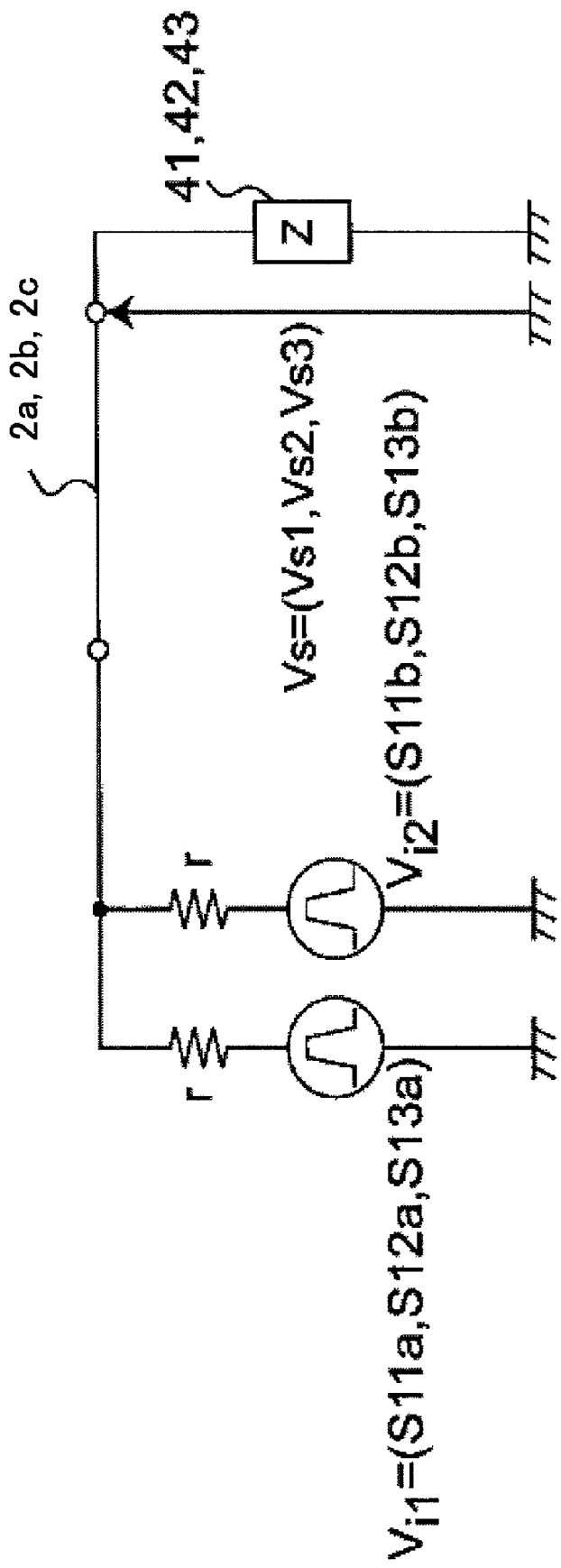
FIG. 17 is a circuit diagram that shows an equivalent network of the signal transmitter 1 and the signal lines 2a, 2b, and 2c, for describing the signal voltages Vs1, Vs2, and Vs3 of the signal lines 2a, 2b, and 2c of FIG. 13.

FIG. 16 is a diagram that shows the relationship between the bit information that is transferred, and the signal voltages Vs1, Vs2, and Vs3 of the transmitted signals that are transmitted by the signal lines 2a, 2b, and 2c of the signal transmission route (differential transmission line) 2, in the multiple differential transmission system of FIG. 13, and FIG. 17 is a circuit diagram that shows an equivalent network of the signal transmitter 1 and the signal lines 2a, 2b, and 2c, for describing the signal voltages Vs1, Vs2, and Vs3 of the signal lines 2a, 2b, and 2c of FIG. 13. The signal voltages Vs1, Vs2, and Vs3 of the signal lines 2a, 2b, and 2c are described here in reference to FIG. 16 and FIG. 17.

The signal voltages Vi1 and Vi2 from two differential drivers (1a,1b; 1b,1c; 1c,1a) are superimposed in the signal lines 2a, 2b, and 2c. With r as the internal resistance of the differential drivers 1a, 1b, and 1c, and Z as the impedance of the terminal resistors 41, 42, and 43 of the signal receiver 3 (the input impedance of the differential receivers 3a, 3b, and 3c is infinite (ideal value)), the signal voltage Vs that is generated in the signal lines 2a, 2b, and 2c is represented by the following equation.

Eq. 3

$$V_s = \frac{V_{i1} + V_{i2}}{r + 2Z} Z \quad (3)$$

Here, r can be regarded as significantly smaller than Z, and thus the equation can be approximated as follows.

Eq. 4

$$V_s = \frac{1}{2}(V_{i1} + V_{i2}) \quad (4)$$

FIG. 18 is a diagram that shows the relationship between the bit information that is transmitted, and the polarity of the terminal voltages V1, V2, and V3 of the terminal resistors 41, 42, and 43 of the signal receiver 3, in the multiple differential transmission system of FIG. 13.

From FIG. 18 it can be understood that by determining the current direction or the polarity of the terminal voltage from the potential difference that occurs between a pair of adjacent signal lines when superimposed on the three signal lines 2a, 2b, and 2c (the terminal voltages of the terminal resistors 41, 42, and 43), it is possible to decode the bit information signal that has been output by the differential drivers 1a, 1b, and 1c in six states other than when all bits are 0 or 1. Further, the signal voltage that is applied to the signal lines 2a, 2b, and 2c of the signal transmission route (differential transmission line) 2 totals 0 in all cases where the bit information signal is transmitted, and the noise that radiates from the signal lines 2a, 2b, and 2c cancels itself out, and thus, like with the normal signal transmission method, it is possible to achieve transmission in which there is little noise.

Figure 19:
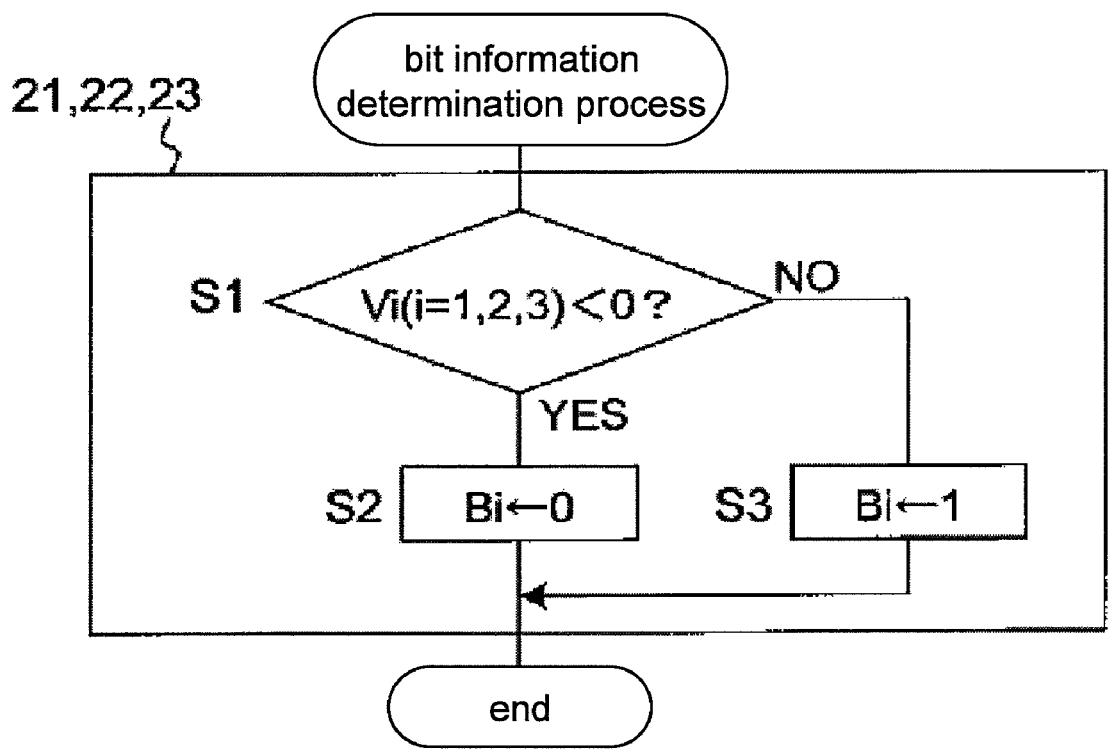
FIG. 19 is a flowchart that illustrates the bit information decision process that is executed by the differential receivers 3a, 3b, and 3c of the signal receiver 3 of FIG. 13.

FIG. 19 is a flowchart that illustrates the bit information decision process that is executed by the differential receivers 3a, 3b, and 3c of the signal receiver 3 of FIG. 13.

In FIG. 19, first in step S1 the differential receivers 3a, 3b, and 3c determine whether the current flowing to the terminals 41, 42, and 43 is negative, or whether the terminal voltage Vi (i=1, 2, 3) of the terminal resistors 41, 42, and 43 is negative.

When the result is YES, the procedure advances to step S2 and a 0 is set for the bit information Bi, and when the result is NO, then the procedure advances to step S3 and a 1 is set for the bit information Bi. The bit information decision process is then ended.

(1.2.2: Second Multiple Differential Transmission System)

Figure 20:
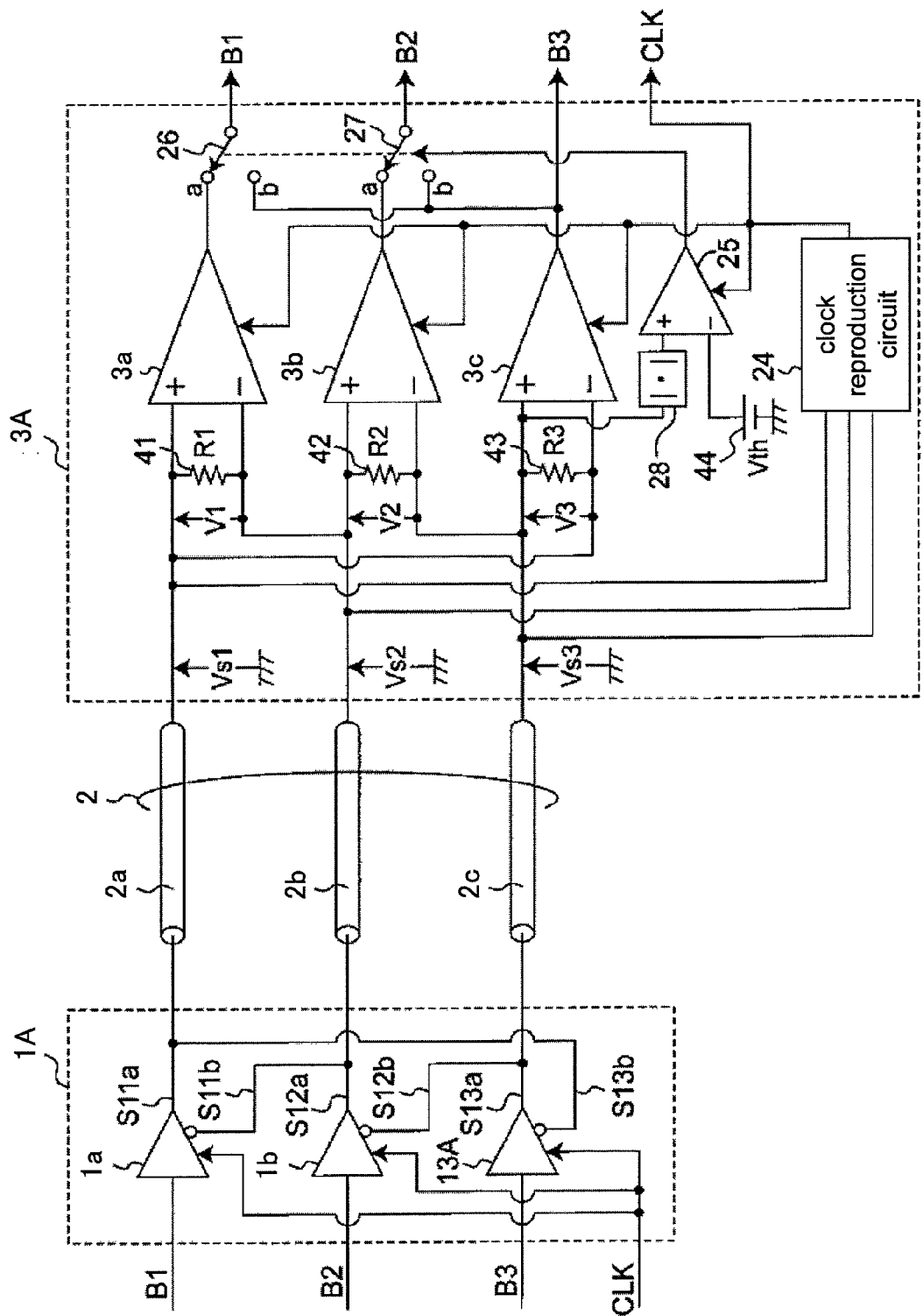
FIG. 20 is a block diagram that shows the configuration of a second multiple differential transmission system that includes the differential transmission line according to the first embodiment of the invention.

FIG. 20 is a block diagram that shows the configuration of a second multiple differential transmission system that includes the differential transmission line according to this embodiment of the invention. In FIG. 20, the second multiple differential transmission system is made by connecting a signal transmitter (differential driver IC) 1A and a signal receiver (differential receiver IC) 3A via a signal transmission route (differential transmission line) 2. Like in the first multiple differential transmission system, the signal transmitter 1A is provided with three differential drivers 1a, 1b, and 13A, the method of connecting the differential drivers 1a, 1b, and 13A with the signal lines 2a, 2b, and 2c is the same as in the first multiple differential transmission system, and the binary voltage levels of the output signals of the differential driver 1a and the differential driver 1b are equal to ±1 V, whereas the binary voltage level of the output signal of the differential driver 13A is equal to ±1.5 V, and its absolute value is set higher than the differential drivers 1a and 1b.

The signal receiver 3A is characterized over the signal receiver 3 of the first multiple differential transmission system in that it further includes a comparator 25 that has a threshold voltage source 44, switches 26 and 27 that are operated to switch by an output signal from the comparator 25, and an absolute value calculator 28. In the second multiple differential transmission system, the absolute value calculator 28 detects the terminal voltage V3 of the terminal resistor 43 and then calculates its absolute value |V3| and outputs a voltage signal that indicates this to the non-inverted input terminal of the comparator 25. The comparator 25 compares the absolute value |V3| of the terminal voltage V3 with the threshold voltage Vth from the threshold voltage source 44, and when |V3|>|Vth|, it outputs a high level control signal to the switches 26 and 27 to cause the switches 26 and 27 to switch to a contact a, whereas when |V3|≦|Vth|, it outputs a low level control signal to the switches 26 and 27 to cause the switches 26 and 27 to switch to a contact b. The differential receivers 3a, 3b, and 3c execute the bit information determination as discussed above in synchronization with the clock CLK that is input, and output bit information signals B1, B2, and B3, respectively. Here, when the switches 26 and 27 have been switched to the contact a (the processing of steps S21 to S23 is executed when YES in step S11 in FIG. 24), the bit information signal B1 is output from the differential receiver 3a via the contact a of the switch 26, the bit information signal B2 is output from the differential receiver 3b via the contact a of the switch 27, and the bit information signal B3 is output from the differential receiver 3c as it is. On the other hand, when the switches 26 and 27 have been switched to the contact b (the processing of steps S12 to S14 is executed when NO in step S11 in FIG. 24), a bit information signal whose determination result (000 or 111) of the bit information signal B3 from the differential receiver 3c is output as the bit information signals B1, B2, and B3.

When Vd1, Vd2, and Vd3 are the absolute values of the binary signal voltages of the output signals of the differential drivers 1a, 1b, and 13A, then with the settings of the second multiple differential transmission system (Vd3>Vd1 (for example, when Vd1=Vd2=1.0 V; Vd3=1.5 V), a method of distinguishing the bit information signals 000 and 111 from all other bit information signals can be executed under the following conditions.

(1) |Vd1|=|Vd2|

(2) |Vd3|≠|Vd1|: Because when Vd3=Vd1, and bit information signals 000 and 111 are transmitted, the potential difference between the signal lines becomes 0, making the determination impossible.

(3) |Vd3|≠|3Vd1|: Because when Vd3=3Vd1, and bit information signals 010 to 101 are transmitted, the potential difference of 0 occurs between the signal lines, making the determination impossible.

(4) |Vd3|>|Vd1|/2: Because the threshold value |Vth| becomes 0 or lower, making the determination impossible.

(5) |Vd1−Vd3|<|Vth|: This is the threshold value condition. Thus, determination is possible only with the comparator 25 and the absolute value calculator 28.

In the first setting example, the threshold value Vth is set to 0.5 V<Vth<1.0 V, and for example Vth=0.8 V.

Figure 21:
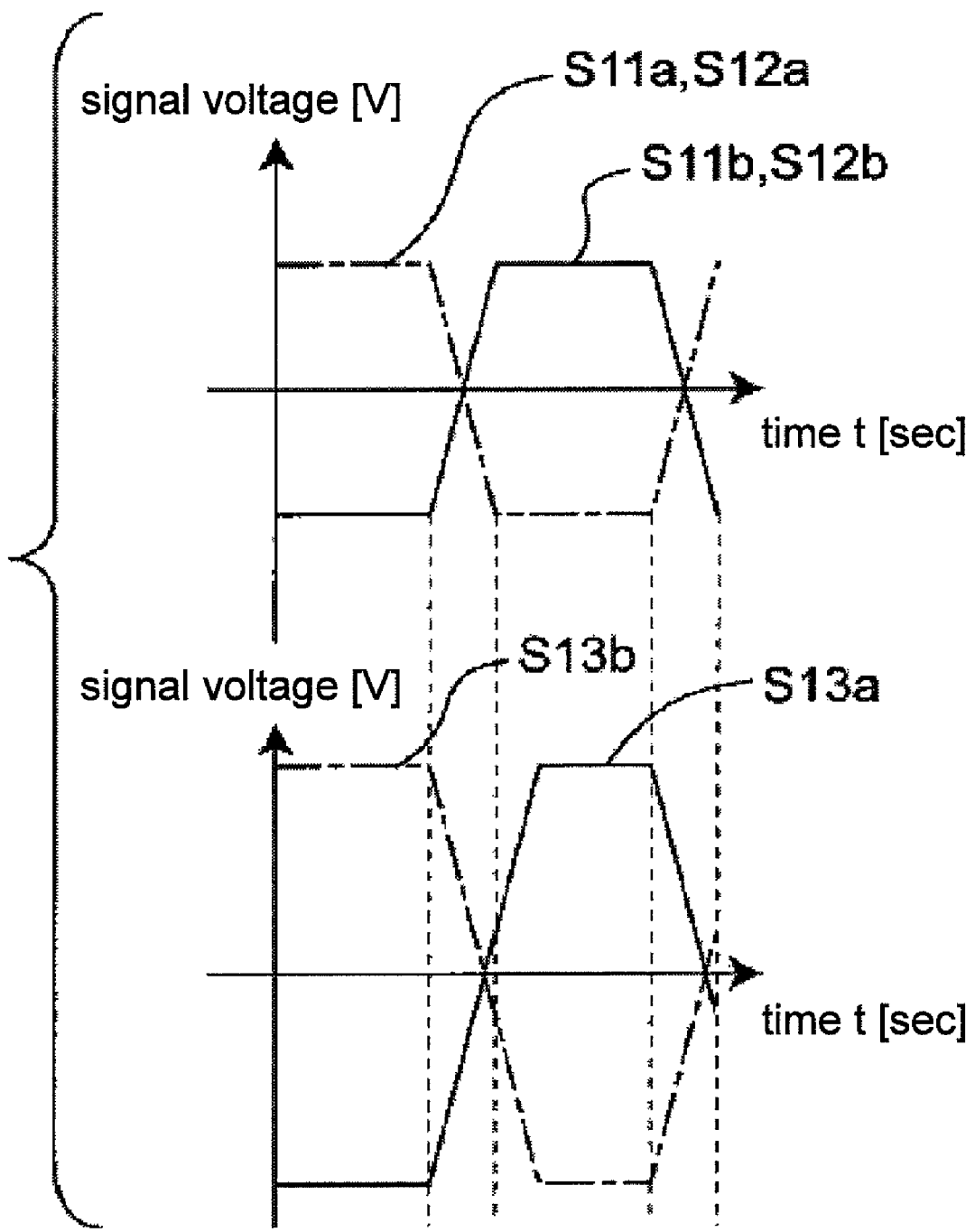
FIG. 21 is a signal waveform diagram that shows the signal waveforms of the output signals S11a, S11b, S12a, S12b, S13a, and S13b of the differential drivers 1a, 1b, and 13A of FIG. 20.
Figure 22:
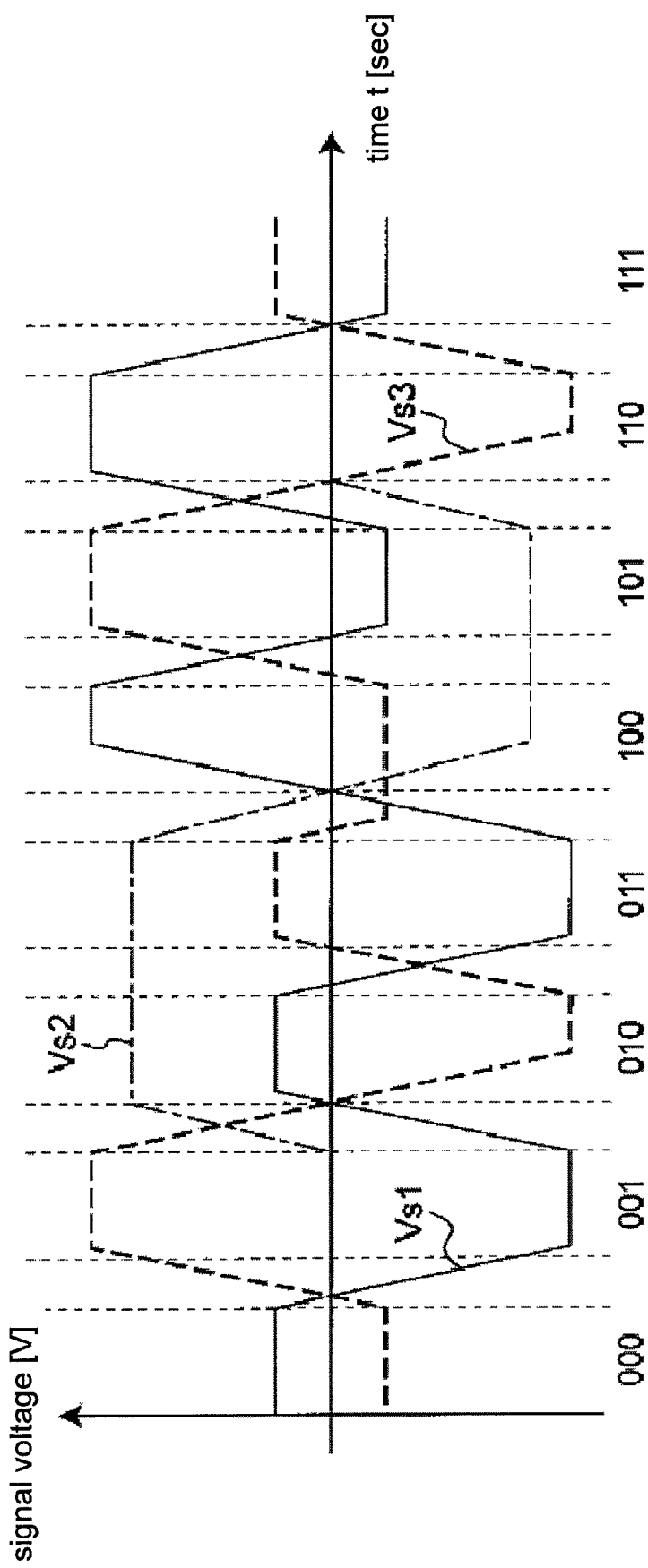
FIG. 22 is a waveform diagram that shows the relationship between the signal waveforms of the signal voltages Vs1, Vs2, and Vs3 of the transmitted signals that are transmitted via the signal lines 2a, 2b, and 2c of the signal transmission route (differential transmission line) 2 in FIG. 20, and the bit information that is assigned.

FIG. 21 is a signal waveform diagram that shows the signal waveforms of the output signals S11a, S11b, S12a, S12b, S13a, and S13b of the differential drivers 1a, 1b, and 13A of FIG. 20. FIG. 22 is a waveform diagram that shows the relationship between the signal waveforms of the signal voltages Vs1, Vs2, and Vs3 of the transmitted signals that are transmitted via the signal lines 2a, 2b, and 2c of the signal transmission route (differential transmission line) 2 in FIG. 20, and the bit information that is assigned. Further, FIG. 23 is a diagram that shows the relationship between the bit information that is transmitted, the signal voltages Vs1, Vs2, and Vs3 of the transmitted signals that are transmitted over the signal lines 2a, 2b, and 2c, and the terminal voltages V1, V2 and V3, and their polarities, of the terminal resistors 41, 42, and 43 of the signal receiver 3A, in the multiple differential transmission system of FIG. 20.

As described above, by setting only the signal voltage level of only the one differential driver 13A to a different value than the signal voltage levels of the other differential drivers 1a and 1b, and providing the circuit elements 25 through 28, which form a total bit compensation circuit, it is possible to decode the bit information signal in all eight states, including instances where all bits are 0 or 1. The signal voltage that is applied to the signal lines 2a, 2b, and 2c of the signal transmission route (differential transmission line) 2 totals 0 regardless of the bit information that is transmitted, such that the noise that radiates from the signal lines 2a, 2b, and 2c cancels itself out, and thus, like in ordinary differential transmission, it is possible to achieve transmission in which there is little noise.

Figure 24:
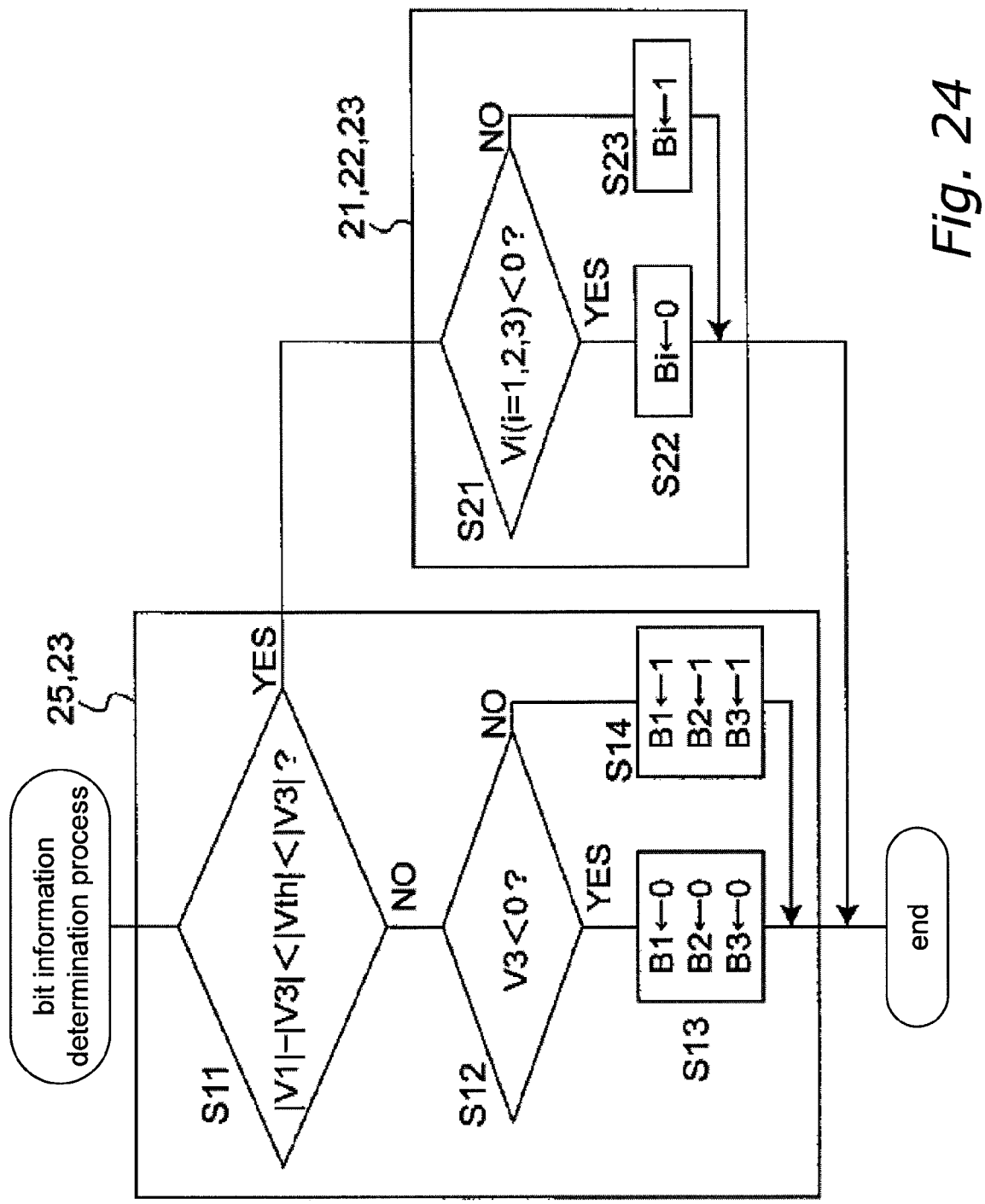
FIG. 24 is a flowchart that shows a first working example of the bit information determination process that is executed by the differential receivers 3a, 3b, and 3c of the signal receiver 3A and the comparator 25 in the multiple differential transmission system of FIG. 20.

FIG. 24 is a flowchart that shows a first working example of the bit information determination process that is executed by the differential receivers 3a, 3b, and 3c of the signal receiver 3A and the comparator 25 in the multiple differential transmission system of FIG. 20.

In FIG. 24, first in step S11 the comparator 25 determines whether or not the absolute value |V3| of the terminal voltage V3 of the terminal resistor 43 exceeds the threshold value Vth. It should be noted that in this multiple transmission system, |V1−V3|<|Vth| has been set in advance in accordance with the above threshold value conditions (|Vd1−Vd3|<|Vth|). When step S11 is NO the procedure advances to step S12, and when YES the procedure advances to step S21, and the differential receivers 3a, 3b, and 3c determine whether or not the terminal voltage Vi (i=1, 2, 3) of the terminal resistors 41, 42, and 43 is negative polarity, and when YES the procedure advances to step S22 and 0 is set as the bit information signal Bi, whereas when NO the procedure is advanced to step S23 and 1 is set as the bit information Bi. The bit information determination processing is then ended. In step S12 it is determined whether the terminal voltage V3 of the terminal resistor 43 is negative, and if YES, the procedure advances to step S13 and all bit information signals B1, B2, and B3 are set to 0, whereas if NO, the procedure advances to step S14 and all bit information signals B1, B2, and B3 are set to 1. The bit information determination process is then ended.

Modified Example

Figure 25:
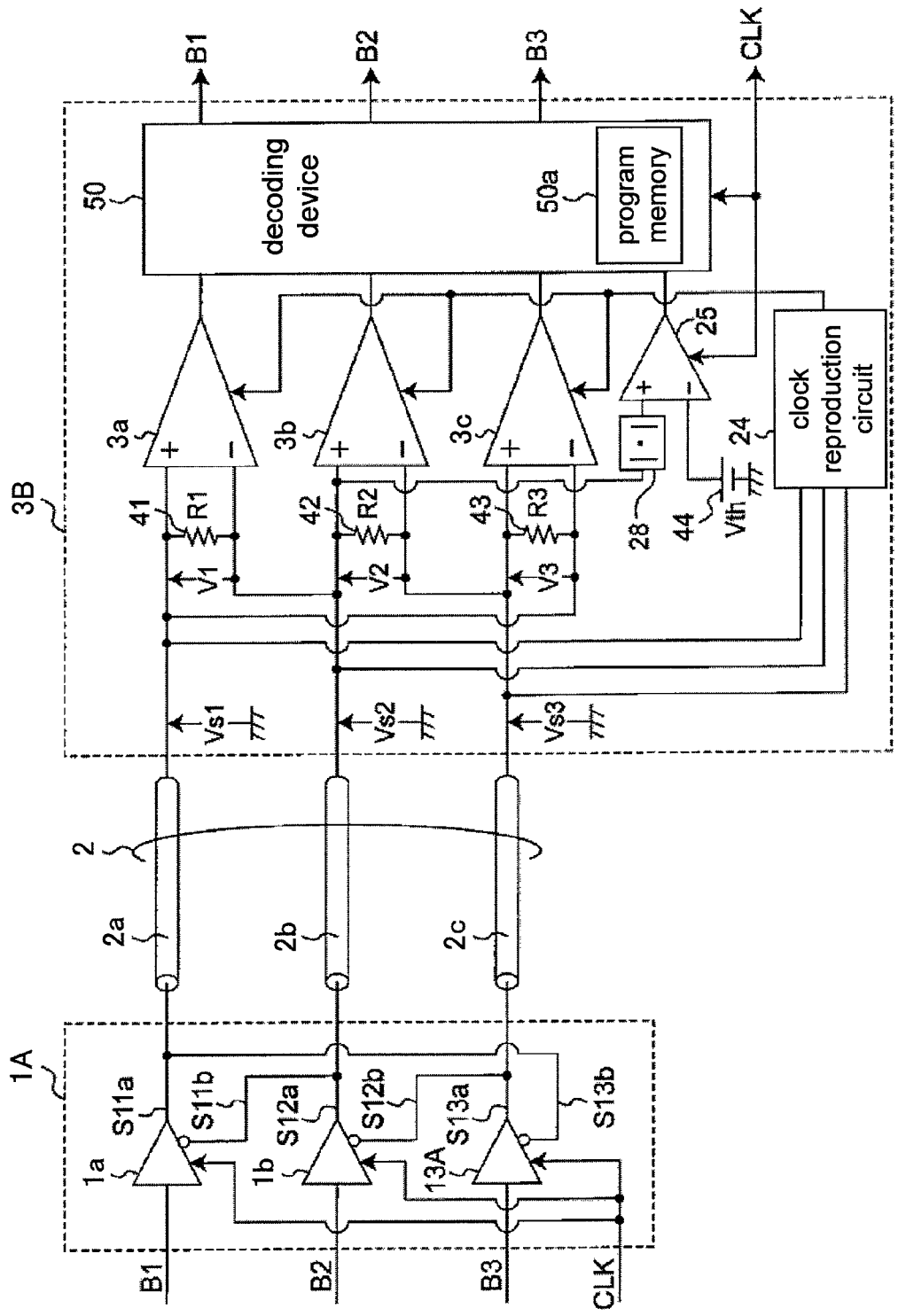
FIG. 25 is a block diagram that shows the configuration of a multiple differential transmission system according to a modified example of the second multiple differential transmission system.

FIG. 25 is a block diagram that shows the configuration of a multiple differential transmission system according to a modified example of the second multiple differential transmission system. The multiple differential transmission system of this modified example is characterized in that, compared to the second multiple differential transmission system of FIG. 20, it is provided with a signal receiver 3B instead of the signal receiver 3A, and the signal receiver 3B is provided with a decoding device 50 that has a program memory 50a and that executes the bit information determination process of FIG. 26 (which is pre-stored in the program memory 50a) instead of the switches 26 and 27, as shown in FIG. 25. It should be noted that the absolute value calculator 28 detects the terminal voltage V2 of the terminal resistor 42 and calculates the absolute value |V2|=|V1+V3| and outputs a signal that indicates the result of this calculation to the non-inverted input terminal of the comparator 25.

In the multiple differential transmission system according to this modified example, a method of distinguishing the bit information signals 000 and 110, and 111 and 000, can be executed under the following conditions.

(1) |Vd1|=|Vd2|

(2) |Vd3|≠|Vd1|: Because when Vd3=Vd1, and the bit information signals 000 and 111 are transmitted, the potential difference between the signal lines becomes 0, making the determination impossible.

(3) |Vd3|≠|3Vd1|: Because when Vd3=3Vd1, and bit information signals 010 to 101 are transmitted, a potential difference of 0 occurs between the signal lines, making the determination impossible.

(4) |Vd1−Vd3|<|Vth|: This is the threshold value condition. Thus, determination is possible only with the comparator 25 and the absolute value calculator 28. It should be noted that in FIG. 25, the absolute value calculator 28 computes the absolute value |V2| of the terminal voltage V2 and outputs this to the comparator 25.

Figure 26:
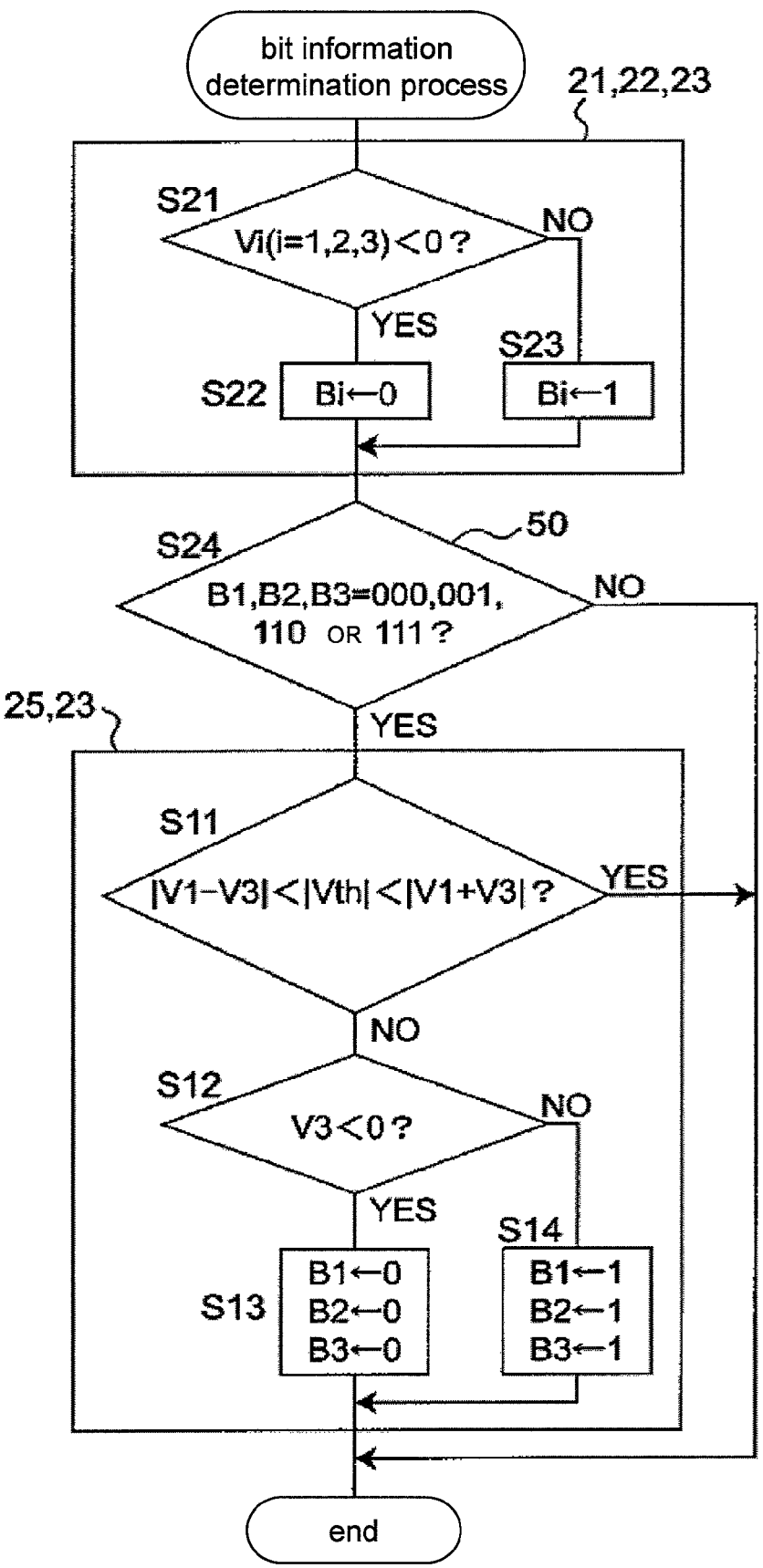
FIG. 26 is a flowchart that shows a second working example of the bit information determination process that is executed by the decoding device 50 of the signal receiver 3B in the multiple differential transmission system of FIG. 25.

In FIG. 25, the decoding device 50 is constituted by a CPU or DSP, for example, and executes a decoding process by executing the bit information determination processing of FIG. 26, which is stored on the program memory 50a, in accordance with the signals from the differential receivers 3a, 3b, and 3c and the comparator 25, in synchronization with the clock from the clock reproduction circuit 24, to produce the bit information signals B1, B2, and B3, and outputs these.

FIG. 26 is a flowchart that shows a second working example of the bit information processing that is executed by the decoding device 50 of the signal receiver 3B in the multiple differential transmission system of FIG. 25. In FIG. 26, the steps S21 to S23 are processes that are executed by the differential receivers 3a, 3b, and 3c, step S24 is a process that is executed by the decoding device 50 only, and step S11 through S14 are processes that are executed by the differential receiver 3c and the comparator 25.

In FIG. 26, first the differential receivers 3a, 3b, and 3c determine whether or not the terminal voltage Vi (i=1, 2, 3) of the terminal resistors 41, 42, and 43 is negative polarity, and when YES the procedure advances to step S22 and 0 is set as the bit information signal Bi, whereas when NO the procedure advances to step S23 and 1 is set as the bit information Bi, and then the procedure advances to step S24. In step S24 it is determined whether or not the bit information signals B1, B2, and B3 are 000, 001, 110, or 111, and when YES the procedure advances to step S11, whereas when NO the bit information determination process is ended. In step S11 the comparator 25 determines whether or not the absolute value |V2-=-V1+V3| of the terminal voltage V2 of the terminal resistor 43 exceeds the threshold value Vth. It should be noted that in this example, |V1-V3|<|Vth| has been set in advance in accordance with the above threshold value conditions (-Vd1-Vd3|<|Vth|). When step S11 is NO the procedure advances to step S12, and when YES the bit information determination process is ended. In step S12 it is determined whether the terminal voltage V3 of the terminal resistor 43 is negative, and when YES the procedure advances to step S13 and all bit information signals B1, B2, and B3 are set to 0, whereas when NO the procedure advances to step S14 and all bit information signals B1, B2, and B3 are set to 1.

(1.2.3: Third Multiple Differential Transmission System)

FIG. 27 is a diagram that shows the relationship between the bit information that is transmitted, the signal voltages Vs1, Vs2, and Vs3 of the transmitted signals that are transmitted over the signal lines 2a, 2b, and 2c, and the terminal voltages V1, V2, and V3, and their polarities, of the terminal resistors 41, 42, and 43 of the signal receiver 3 (or 3A), in a third multiple differential transmission system that includes the differential transmission line according to this embodiment of the invention (using the configuration of FIG. 20, differing only in the setting conditions). The third multiple differential transmission system differs from the second multiple differential transmission system only in its setting conditions, and is characterized in that Vd3<Vd1 (for example, Vd1=Vd2=1.0 V; Vd3=0.8 V). It should be noted that the structural configuration of the multiple differential transmission system of FIG. 20 is used.

Figure 28:
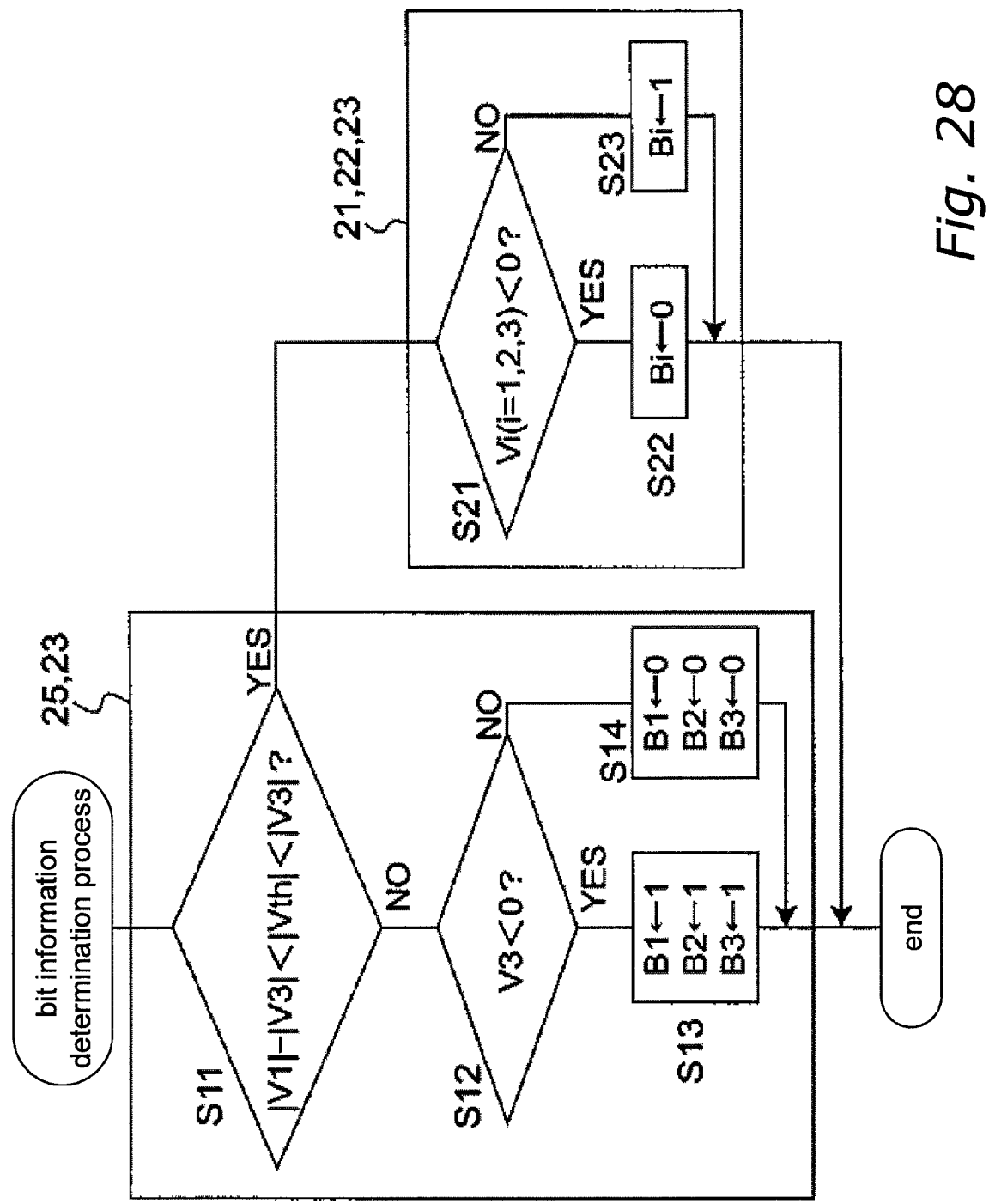
FIG. 28 is a flowchart illustrating a third working example of the bit information determination process that is executed by the differential receivers 3a, 3b, and 3c of the signal receiver 3B and the comparator 25 in the third multiple differential transmission system.

FIG. 28 is a flowchart illustrating a third working example of the bit information determination process that is executed by the differential receivers 3a, 3b, and 3c of the signal receiver 3A and the comparator 25 in the third multiple differential transmission system. The bit information determination process of FIG. 28 differs from the bit information determination process of FIG. 24 only in that the processing of step S13 has been switched with the processing of step S14. The third multiple differential transmission system having the above configuration has the same actions and effects as the second multiple differential transmission system.

Modified Example

Figure 29:
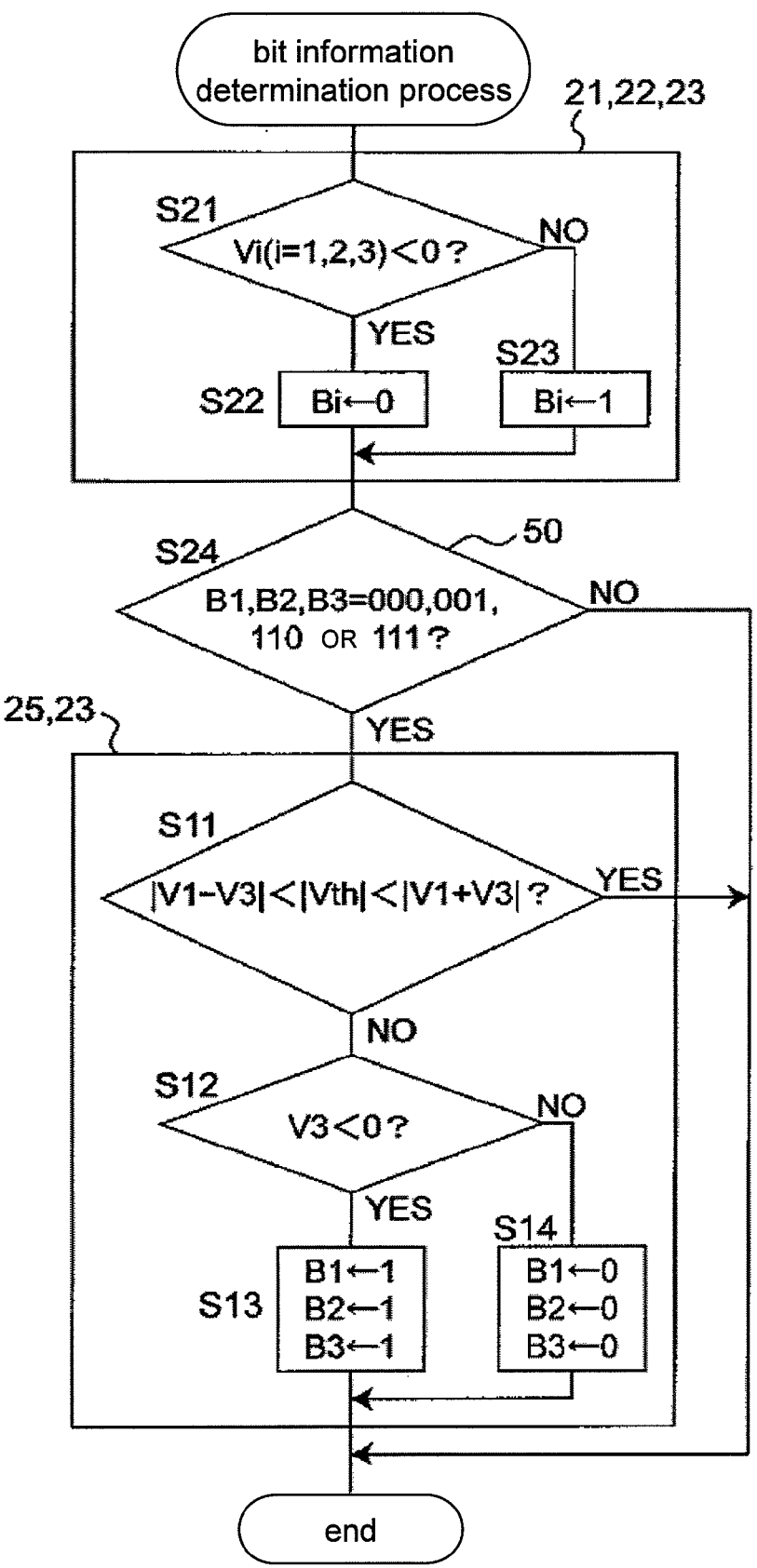
FIG. 29 is a flowchart that illustrates a fourth example of the bit information determination process that is executed by the decoding device 50 of the signal receiver 3B in a multiple differential transmission system according to a modified example of the third multiple differential transmission system (uses the configuration of FIG. 25, differing only in the setting conditions).
Figure 30:
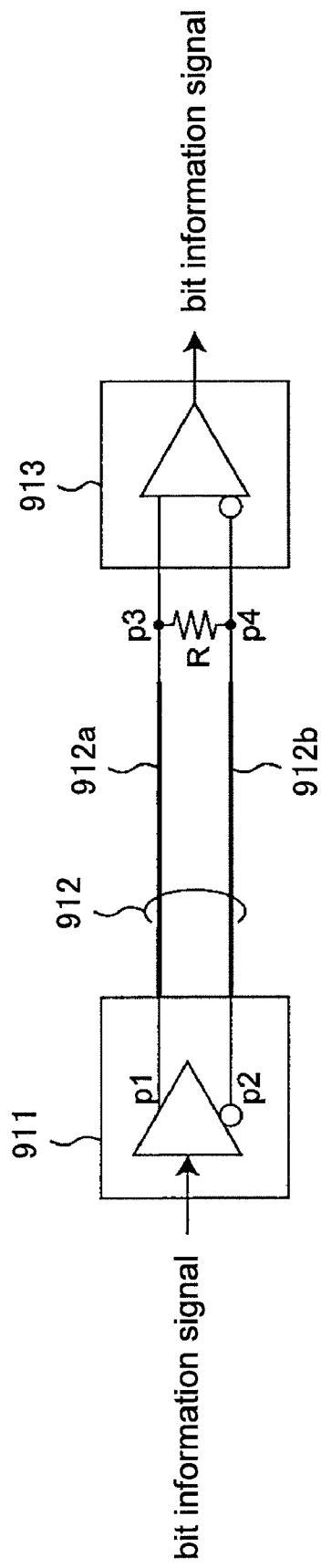
FIG. 30 is a circuit diagram of a differential transmission circuit according to a first conventional technology.
Figure 31:
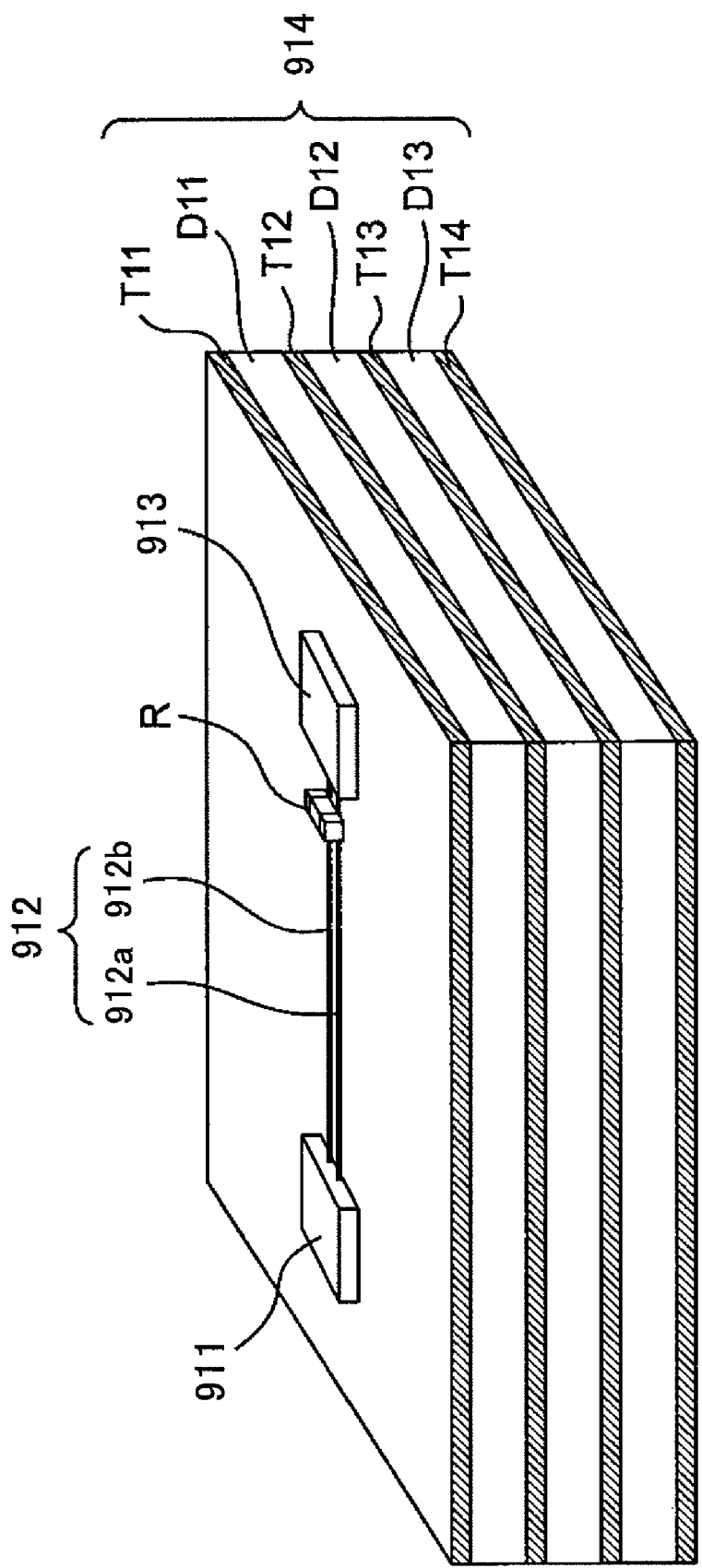
FIG. 31 is a perspective view that schematically shows the configuration of the differential transmission circuit of FIG. 30.
Figure 32:
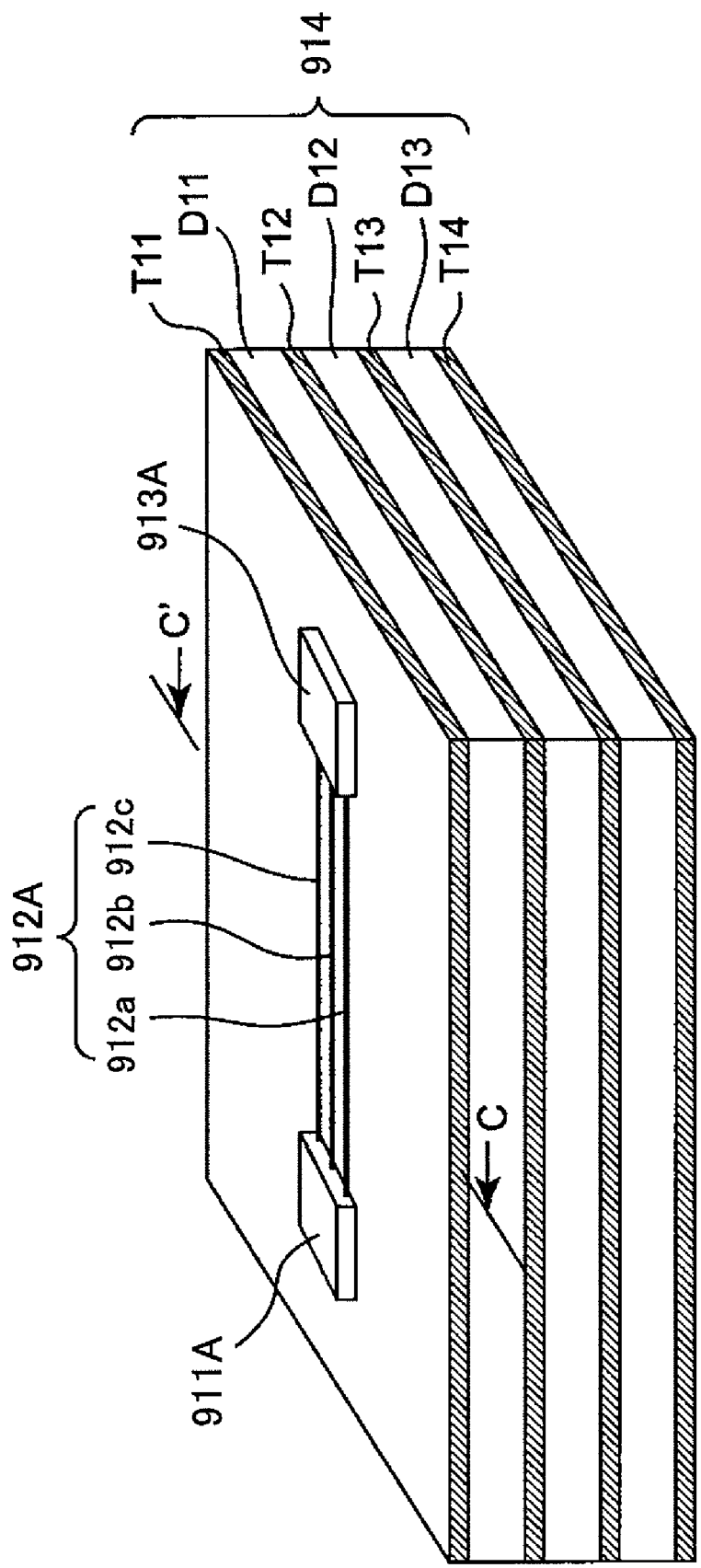
FIG. 32 is a perspective view that schematically shows the configuration of a differential transmission circuit according to a second conventional technology.
Figure 33:
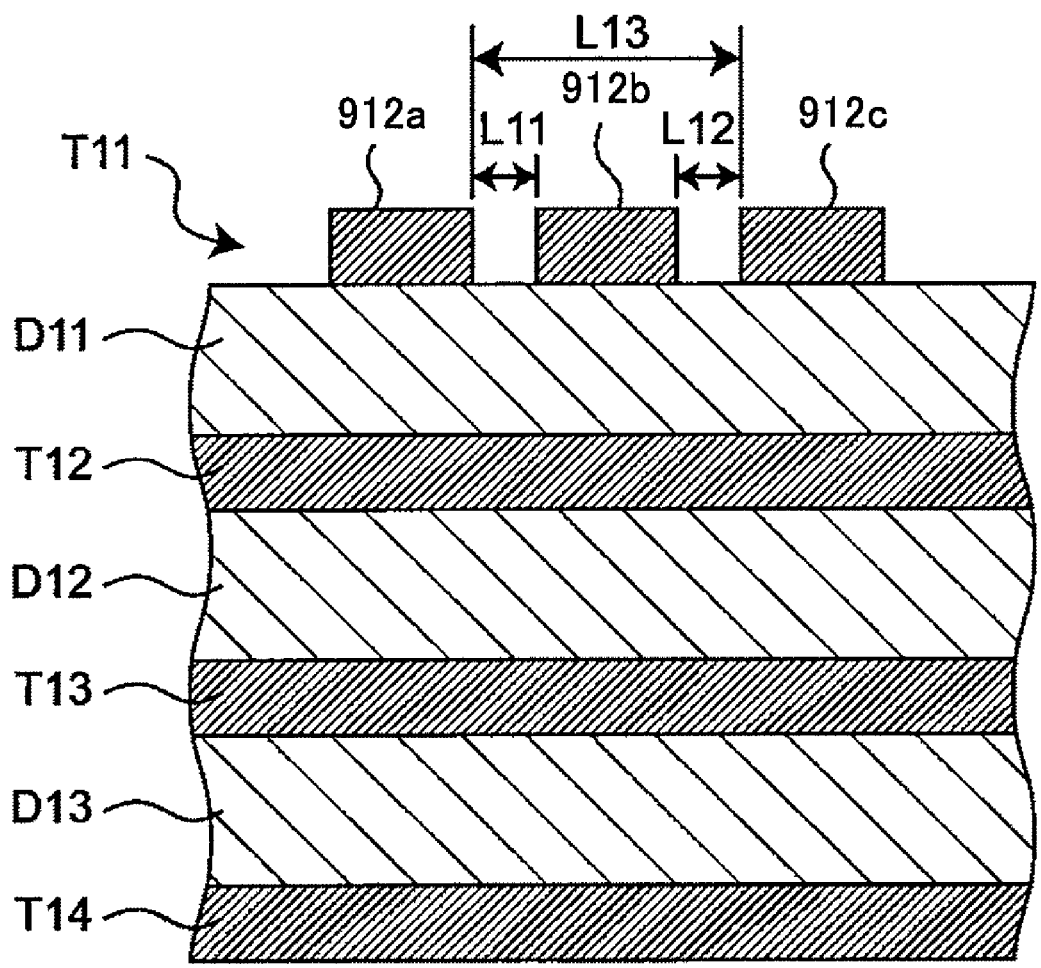
FIG. 33 is a cross-sectional diagram that shows a section taken along the line C-C' in FIG. 32.

FIG. 29 is a flowchart that illustrates this example of the bit information determination process that is executed by the decoding device 50 of the signal receiver 3B in a multiple differential transmission system according to a modified example of the third multiple differential transmission system (using the configuration of FIG. 25, differing only in the setting conditions). Here, the structural configuration of the multiple differential transmission system of FIG. 25 is used. The bit information determination process of FIG. 29 differs from the bit information determination process of FIG. 26 only in that the processing of step S13 has been switched with the processing of step S14. This multiple differential transmission system according to a modified example of the third multiple differential transmission system with this configuration has the same actions and effects as the multiple differential transmission system according to the modified example of the second multiple differential transmission system.

The differential transmission line 2 according to this embodiment of the invention is not limited to three signal lines, and it may be provided with four or more signal lines. In this case, the arrangement of the output terminals for the differential signals in the bottom surface of the differential driver IC is determined such that, compared to the output terminal that is connected to the signal line that is provided in the deepest conductor layer (that is, the conductor layer farthest from the differential driver IC), the output terminals that are connected to the signal lines that are provided in the other conductor layers are spaced at a substantially different distance from the differential driver IC in the direction parallel to the signal line parallel segment based on the distance from the conductor layer in which the signal line is provided and which is farthest from the differential driver IC to the other conductor layers in which signal lines are provided, so as to compensate for the difference in distance with each signal line from the conductor layers in which the differential driver IC is provided to the conductor layers in which the central segments of the signal lines are provided.

When the signal lines 2a, 2b, and 2c are disposed at the apexes of an equilateral triangle, like in FIGS. 1 through 3, looking at a section perpendicular to the longitudinal direction of the central segments of the signal lines 2a, 2b, and 2c, the output terminals 1Ea, 1Eb, and 1Ec of the differential driver IC are not limited to being located at the apexes of an equilateral triangle, and instead it is also possible for the distance L11 between the conductor layers T2 and T3 to be equal to the distance from the center point between the output terminals 1Ea and 1Ec to the output terminal 1Eb of the differential driver IC1. With this configuration as well, the ends of the signal lines 2a, 2b, and 2c on the differential driver IC1 side of the signal line parallel segment, and the output terminals 1Ea, 1Eb, and 1Ec of the differential driver IC1, can be connected by equal distances.

There is no limitation to disposing the signal lines 2a, 2b, and 2c so that when looking at a section perpendicular to the longitudinal direction of the central segment of the signal lines 2a, 2b, and 2c they are positioned at the apexes of an equilateral triangle, like in the case of FIGS. 1 through 3, and for example, they can also be disposed located at the apexes of an isosceles triangle. Here, in FIG. 2, L1=L2≠L3.

The above embodiment describes the odd mode impedance of the differential transmission line 2 set at 50Ω and the differential impedance set at 100Ω, but it is also possible to set the impedances to other values. The above embodiment describes an example in which three differential driver circuits 1a, 1b, and 1c are formed in the differential driver IC1, and three terminal resistors Ra, Rb, and Rc and three differential receiver circuits 3a, 3b, and 3c are formed in the differential receiver IC3, but the effects are the same when ICs in which a single circuit is formed are mounted onto a plurality of printer circuit boards 4. The above embodiment describes an example in which terminal resistors Ra, Rb, and Rc are formed in the differential receiver IC3, but the same effects are had when the terminal resistors Ra, Rb, and Rc are mounted onto the printed circuit board 4 as external components. The cross-sectional shape of the signal lines 2a, 2b, and 2c is not limited to the longitudinal shape or the square shape shown in FIG. 2, and it may be a triangle, circle, oval, or other polygonal shape. The above embodiment describes a case in which etching is used to form the pattern conductors 2ab, 2bb, and 2cb for the signal lines 2a, 2b, and 2c, but the same effect is achieved when the pattern for the signal lines 2a, 2b, and 2c is created by printing. The method for forming the signal lines 2a, 2b, and 2c is not limited to etching or printing, and it is also possible to attach and lay down conductive wiring that has a predetermined cross-sectional shape onto the dielectric layers D3 and D2 during the course of producing the printed circuit board 4, and by laminating other layers onto this, it is possible to bury the signal lines 2a, 2b, and 2c between layers as shown in FIGS. 2 and 3. Moreover, the same effect is achieved when the signal lines 2a, 2b, and 2c are formed by other methods as well, such as electroless plating or vacuum deposition. The above embodiment describes an example in which only the pattern conductors 2ab, 2bb, and 2cb for the signal lines 2a, 2b, and 2c are formed in the conductor layers T2 and T3, but it is also possible to provide other circuit elements in the conductor layers T2 and T3 away from the differential transmission line 2 so that they do not affect it. The above embodiment describes LVDS as an example, but the same effect is obtained with other differential transmission methods as well.

With the differential transmission line 2 of this embodiment, in a differential transmission line that has three signal lines 2a, 2b, and 2c the positions of the differential signal output terminals 1Ea, 1Eb, and 1Ec of the differential driver IC1 are adjusted so as to form the signal lines 2a, 2b, and 2c at equal lengths in their signal line route length adjustment segment on the differential driver IC1 side, allowing their electromagnetic fields to cancel each other out and thus makes it is possible to achieve a multiple differential transmission system with low radiation noise. With this embodiment, it is possible to achieve a differential transmission line with little unwanted radiated noise by providing the signal line route length adjustment segment in the differential transmission line 2 in this manner.

Second Embodiment

Figure 5:
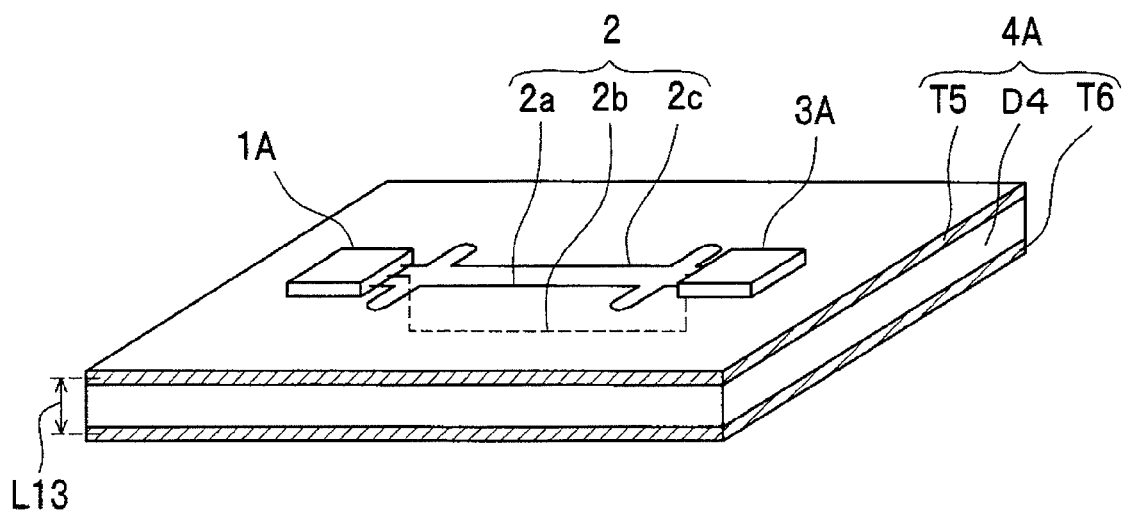
FIG. 5 is a perspective view that shows the schematic configuration of the differential transmission circuit, with some parts transparent, according to a second embodiment of the invention.
Figure 6:
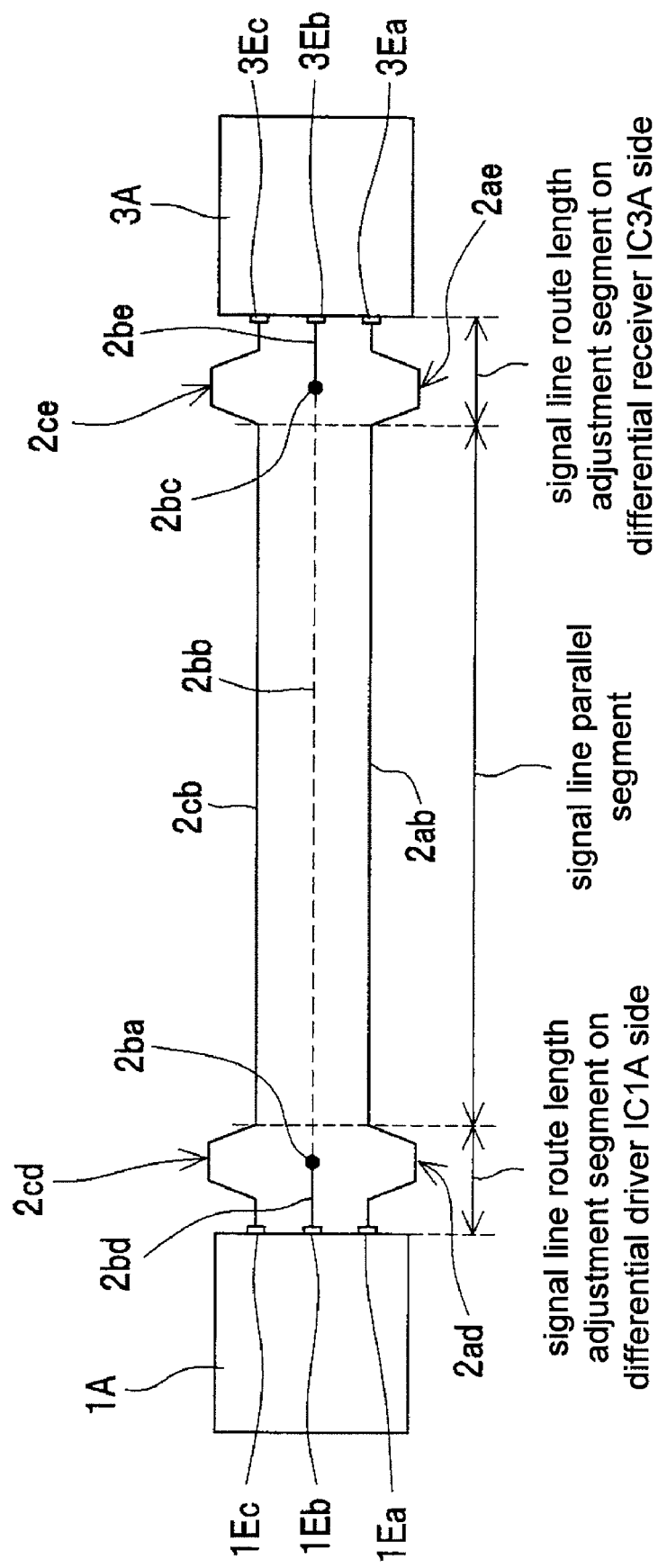
FIG. 6 is a top view of the differential transmission circuit of FIG. 5.

FIG. 5 is a perspective view that shows the schematic configuration of a differential transmission circuit, with some parts transparent, according to a second embodiment of the invention, and FIG. 6 is a top view of the differential transmission circuit of FIG. 5. In this embodiment, in order to form the signal lines 2a, 2b, and 2c at equal lengths in the signal line route length adjustment segment on the differential driver IC1A side, the signal line route length adjustment segments of signal lines 2a and 2c are provided with signal line return portions 2ad, 2ae, 2cd, and 2ce, instead of adjusting the positions of the differential signal output terminals 1Ea, 1Eb, and 1Ec of the differential driver IC1 as in the first embodiment.

The differential transmission circuit of this embodiment is provided in a double-sided printed circuit board 4A, which is provided with two conductor layers T5 and T6 and a dielectric layer D4 between these layers. L13 is the distance between the conductor layers T5 and T6. The differential driver IC1A and the differential receiver IC3A are positioned within the conductor layer T5 separated from one another by a predetermined distance. The differential driver IC1A and the differential receiver IC3A have the same structures and operations as the differential driver IC1 and the differential receiver IC3 of the first embodiment, except that they are packaged as a QFP (quad flat package). One edge of the bottom surface of the rectangular differential driver IC1A is provided with three output terminals 1Ea, 1Eb, and 1Ec that are separated by the same distance, and the edge of the bottom surface of the square differential receiver IC3A that is in opposition to the differential driver IC1A is provided with three input terminals 3Ea, 3Eb, and 3Ec, which are separated by the same distance. FIG. 6 shows only the three output terminals 1Ea, 1Eb, and 1Ec of the differential driver IC1A and the three input terminals 3Ea, 3Eb, and 3Ec of the differential receiver IC3A, and other terminals such as the bit information signal input terminals and the power source terminal of the differential driver IC1A, and the output terminals and the power source terminal of the differential receiver IC3A have been omitted in order to simplify the drawing. The entirety of the signal lines 2a and 2c is formed as the pattern conductors 2ab and 2cb on the conductor layer T5, and they connect the output terminals 1Ea and 1Ec of the differential driver IC1A and the input terminals 3Ea and 3Ec of the differential receiver IC3A, respectively. The signal line 2b is formed by a combination of a through hole conductor and a pattern conductor. More specifically, the part of the signal line 2b that is connected to the output terminal 1Eb of the differential driver IC1A is constituted by the pattern conductor 2bd on the conductor layer T5, the part that is connected to the input terminal 3Eb of the differential receiver IC3A is constituted by a pattern conductor 2be on the conductor layer T5, and the central segment of the signal line 2b is constituted by the pattern conductor 2bb on the conductor layer T6. The pattern conductors 2bd and 2be are formed short so that the majority of the signal line 2b is provided on the conductor layer T6. The pattern conductor 2bd and the pattern conductor 2bb are connected by the through hole conductor 2ba, and the pattern conductor 2be and the pattern conductor 2bb are connected by the through hole conductor 2bc. The pattern conductors 2ab, 2bb, 2cb, 2bd, and 2be are formed by etching the conductor layers T5 and T6, like the pattern conductors 2ab, 2bb, and 2cb in the first embodiment. The conductor layers T5 and T6 may also be provided with circuit elements in addition to the differential driver IC1A, the differential transmission line 2, and the differential receiver IC3A, away from the differential transmission line 2 such that they do not affect it.

Like the signal lines 2a, 2b, and 2c of the first embodiment, the signal lines 2a, 2b, and 2c according to this embodiment are constituted by a signal line parallel segment, a signal line route length adjustment segment on the differential driver IC1A side, and a signal line route length adjustment segment on the differential receiver IC3A side. The signal lines 2a, 2b, and 2c are disposed such that in the signal line parallel segments, the distance between any pair of signal lines is equal to a predetermined value. In particular, the signal lines 2a and 2c are disposed within the conductor layer T5, the signal line 2b is disposed within the conductor layer T6, and the signal lines 2a and 2c are separated by a predetermined distance and the signal line 2b is separated from each of the signal lines 2a and 2c by the same distance. Thus, when looking at a section that is perpendicular to the longitudinal direction of the central segments of the signal lines 2a, 2b, and 2c, the signal lines 2a, 2b, and 2c are disposed at substantially the same spacing on the same circumference, like in the configuration of FIG. 2, and thus are disposed located at the apexes of an equilateral triangle. The signal line route length adjustment segment on the differential driver IC1A side connects the ends of the signal line parallel segment on the differential driver IC1A side and the output terminals 1Ea, 1Eb, and 1Ec of the differential driver IC1A with an equal distance. To achieve this, the signal line return portions 2ad and 2cd are provided in the signal lines 2a and 2c in such a way that they extend the length of the signal lines 2a and 2c by an amount that equals the distance L13 between the conductor layers T5 and T6 (that is, the length of the through hole conductor 2ba). With this configuration, the balance between the signal lines 2a, 2b, and 2c in the signal line parallel segment is maintained, and unwanted radiation noise on the differential transmission line 2 can be effectively reduced. Similarly, the signal line route length adjustment segment on the differential receiver IC3A side connects the ends of the signal line parallel segment on the differential receiver IC3A side and the input terminals 3Ea, 3Eb, and 3Ec of the differential receiver IC3A at equal distances. To achieve this, the signal line return portions 2*ae* and 2*ce* are provided in the signal lines 2*a* and 2*c* in such a way that they extend the length of the signal lines 2*a* and 2*c* by an amount that equals the distance L13 between the conductor layers T5 and T6 (that is, the length of the through hole conductor 2*bc*).

To form the signal line route length adjustment segments of the signal lines 2*a*, 2*b*, and 2*c* on the differential driver IC1A side at equal lengths, it is also possible to set the return distance of the signal line return portions 2*ad*, 2*ae*, 2*cd*, and 2*ce* to substantially ½ of the distance L13 between the conductor layers T5 and T6, for example.

The differential transmission line 2 according to this embodiment of the invention is not limited to the three signal lines 2*a*, 2*b*, and 2*c*, and it is also possible for it to be provided with four or more signal lines, and there is no limitation to the two conductor layers T5 and T6 and it is also possible for it to be provided with three or more conductor layers. In this case, the signal line route length adjustment segments, on the differential receiver IC side, of the signal lines that are provided in the conductor layers other than the conductor layer in which a signal line is provided and which is farthest from the differential driver IC, are provided with signal line return portions that extend the length of the signal lines by the distance from the conductor layer in which a signal line is provided and which is farthest from the differential receiver IC to the other conductor layers in which that signal line is provided, in order to compensate for the differences in each signal from the conductor layers in which the differential driver IC is provided to the conductor layers in which the central segment of the signal lines are provided.

With the differential transmission line 2 according to this embodiment, the signal line return portions 2*ad* and 2*cd* are provided in the signal line route length adjustment segment of the signal lines 2*a* and 2*c* of the differential transmission line 2, and this results in the signal lines 2*a*, 2*b*, and 2*c* being formed at equal lengths in their signal line route length adjustment segments on the differential driver IC1 side, allowing their electromagnetic fields to cancel each other out and making it possible to achieve multiple differential transmission with low radiation noise. According to this embodiment, it is possible to achieve a differential transmission line with little unwanted radiation noise by providing a signal line route length adjustment segment in the differential transmission line 2 in this way. Unlike the first embodiment, in this embodiment the differential driver IC1A, the differential receiver IC3A, the signal lines 2*a* and 2*c*, and some of the signal 2*b*, are disposed in the same conductor layer T5, and thus the structure of the differential transmission circuit can be simplified.

It should be noted that in the example shown in FIGS. 5 and 6, the differential driver IC1A and the differential receiver IC3A are shown packaged as a QFP (quad flat package), but the same effects are achieved when other package types are adopted as well, such as a BGA (ball grid array) type package, or a CSP (chip size package), in which the IC package size is approximately the same size as the IC chip size.

In the various embodiments of the invention, the printed circuit boards 4 and 4A can be formed by a rigid board or a flexible board. Further, there is no limitation regarding the structure in the thickness direction of the board to that shown in drawings, and the printed circuit boards 4 and 4A can be made of multilayer boards provided with more conductor layers and dielectric layers.

It is also possible to combine the configurations of the first embodiment and the second embodiment of the invention. That is, as in the first embodiment, the positions of the output terminals of the differential driver IC and the output terminals of the differential receiver IC are adjusted, and, as in the second embodiment, the signal lines are provided with signal line return portions.

Third Embodiment

Figure 7:
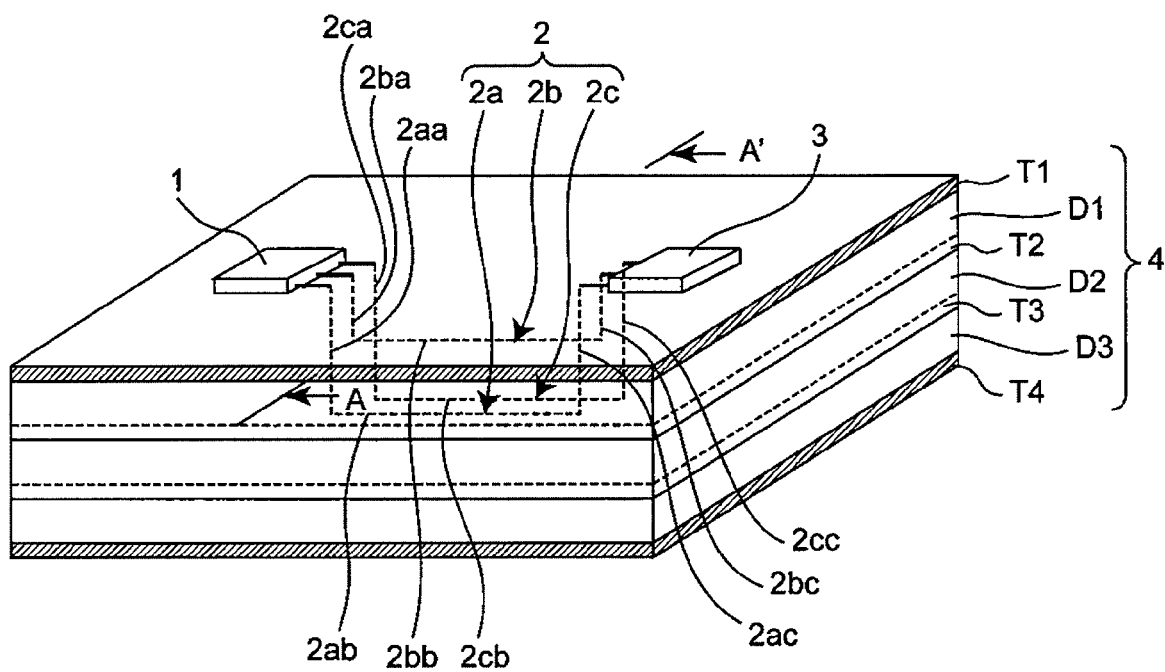
FIG. 7 is a perspective view that shows the schematic configuration of the differential transmission circuit, with some parts transparent, according to a third embodiment of the invention.
Figure 8:
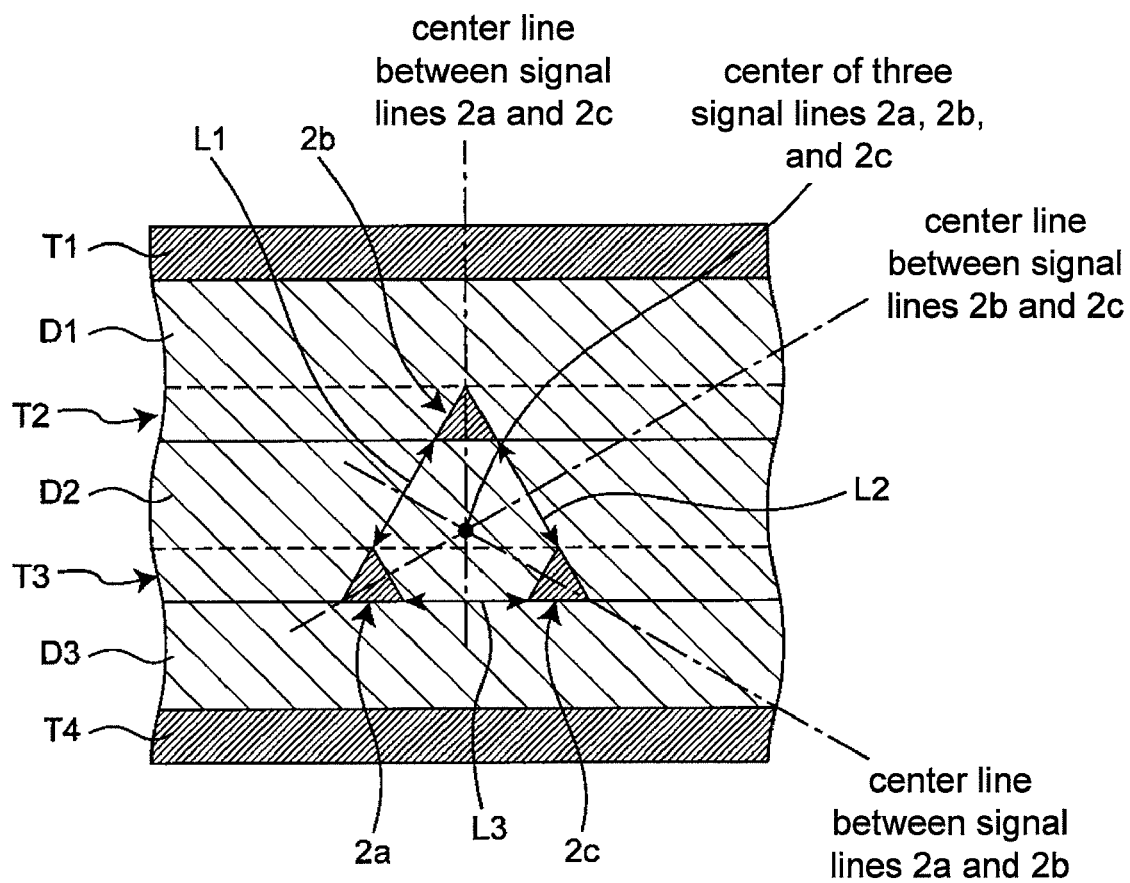
FIG. 8 is a cross-sectional view showing the section cut along the A-A' line in FIG. 7.

FIG. 7 is a perspective view that shows the schematic configuration of a differential transmission circuit, with some parts transparent, according to a third embodiment of the invention, and FIG. 8 is a cross-sectional view showing the section cut along the line A-A' in FIG. 7. With the differential transmission circuit of this embodiment, three bit information signals are transmitted via a differential transmission line 2 that is made from three signal lines 2*a*, 2*b*, and 2*c*. It is characterized in that the three signal lines 2*a*, 2*b*, and 2*c* are disposed parallel to one another, and in a section perpendicular to the longitudinal direction of the differential transmission line 2, the three signal lines 2*a*, 2*b*, and 2*c* are disposed at substantially the same spacing on a same circumference, and thus they are located at the apexes of an equilateral triangle. Moreover, in the section perpendicular to the longitudinal direction of the differential transmission line 2, the signal lines have an equilateral triangular cross-sectional shape that is symmetrical to the center line between any pair of two adjacent signal lines of the three signal lines 2*a*, 2*b*, and 2*c*.

The differential driver IC1 and the differential receiver IC3 are connected by the differential transmission line 2, which is made of the three signal lines 2*a*, 2*b*, and 2*c*, and the three bit information signals that are input to the differential driver IC1 are transmitted to the differential driver IC3 via the differential transmission line 2 and output. The internal structure of the differential driver IC1 and the differential receiver IC3, and signal transmission, will be described in detail later in reference to FIG. 4. The differential driver IC1 and the differential receiver IC3 are located within the uppermost conductor layer T1 of the printed circuit board 4, which is a multilayer board, separated from one another by a predetermined distance. As shown in FIGS. 7 and 8, the printed circuit board 4 is made of four conductor layers T1, T2, T3, and T4 that are provided in that order from the top to the bottom and that allow circuit patterns and various circuit components to be mounted, a dielectric layer D1 between the conductor layers T1 and T2, a dielectric layer D2 between the conductor layers T2 and T3, and a dielectric layer D3 between the conductor layers T3 and T4. The signal lines 2*a*, 2*b*, and 2*c* are disposed extending parallel to one another. The central segments, excluding the ends, of the signal lines 2*a*, 2*b*, and 2*c* are disposed such that the distance between any pair of signal lines is equal to a predetermined value. In order to achieve this arrangement, the central segments of the signal lines 2*a* and 2*c*, and the center segment of the signal line 2*b*, are provided in different layers of the printed circuit board 4, and more specifically, in the configuration shown in FIGS. 7 and 8, the central segments of the signal lines 2*a* and 2*c* are disposed in the conductor layer T3, and the central segment of the signal line 2*b* is disposed in the conductor layer T2. Moreover, when looking at a cross-section perpendicular to the longitudinal direction of the central segments of the signal lines 2*a*, 2*b*, and 2*c*, as shown by FIG. 8 the signal lines 2*a*, 2*b*, and 2*c* are disposed at a substantially equal spacing on the same circumference and therefore are located at the apexes of an equilateral triangle.

In this embodiment, each of the signal lines 2*a*, 2*b*, and 2*c* is made by combining a through hole conductor and a pattern conductor. More specifically, the parts of the signal lines 2*a*, 2b, and 2c that are connected to the three output terminals of the differential driver IC1 are formed by through hole conductors 2aa, 2ba, and 2ca, and the through hole conductors 2aa and 2ca are provided such that they pass from the conductor layer T1 to the conductor layer T3 of the printed circuit board 4 (insulated from the conductor layers T1 and T2), and the through hole 2ba is provided such that it passes from the conductor layer T1 to the conductor layer T2 of the printed circuit board 4 (insulated from the conductor layer T1), and thus, the through hole conductors 2aa, 2ba, and 2ca electrically connect the three output terminals of the differential driver IC1 and the segments of the signal lines 2a, 2b, and 2c disposed in the conductor layer T2 or T3. Similarly, the parts of the signal lines 2a, 2b, and 2c that are connected to the three input terminals of the differential receiver IC3 are formed by through hole conductors 2ac, 2bc, and 2cc, and the through hole conductors 2ac and 2cc are provided such that they pass from the conductor layer T1 to the conductor layer T3 of the printed circuit board 4 (insulated from the conductor layers T1 and T2), and the through hole 2bc is provided such that it passes from the conductor layer T1 to the conductor layer T2 of the printed circuit board 4 (insulated from the conductor layer T1), and thus, the through hole conductors 2ac, 2bc, and 2cc electrically connect the segments of the signal lines 2a, 2b, and 2c that are disposed in the conductor layers T2 or T3, and the three input terminals of the differential receiver IC3. The central segments of the signal lines 2a and 2c are formed by pattern conductors 2ab and 2cb on the conductor layer T3, and the central segment of the signal line 2b is formed by a pattern conductor 2bb in the conductor T2. The pattern conductors 2ab and 2cb are formed by performing etching on a conductor material (such as copper foil with a predetermined thickness (35 μm, for example)) layered onto the dielectric layer D3 as the conductor layer T3, and similarly, the pattern conductor 2bb is formed by etching a conductor material that has been layered onto the dielectric layer D2 as the conductor layer T2. In the configuration of FIG. 8, the cross-section of each of the pattern conductors 2ab, 2bb, and 2cb gradually becomes thinner in the vertical direction, and more particularly, the form an equilateral triangle. In this embodiment, all of the conductor material is removed from parts other than the pattern conductors 2ab and 2cb in the conductor layer T3 and is filled with a dielectric material, all of the conductor material is removed from parts other than the pattern conductor 2bb of the conductor layer T2 and filled in with a dielectric material, and the conductor layers T1 and T4 are formed as ground conductors and are disposed sandwiching from above and below the conductor layers T2 and T3 in which the pattern conductors 2ab, 2bb, and 2cb are formed.

In this way, the differential transmission line 2 of this embodiment is characterized in that the cross-sectional shape of the signal lines 2a, 2b, and 2c substantially forms an equilateral triangle, and in the section perpendicular to the longitudinal direction of the differential transmission line 2 it forms a shape that is disposed symmetrical with respect to the center of the three signal lines 2a, 2b, and 2c, and is symmetrical with respect to a central line between two adjacent signal lines. Thus, the distance L1 between the signal lines 2a, and 2b, the distance L2 between the signal lines 2b and 2c, and the distance L3 between the signal lines 2c and 2a, can be made equal (that is, the three signal lines 2a, 2b, and 2c are disposed at an equal spacing), and the impedances between the signal lines can be made equal, and thus it is possible to achieve a differential transmission line 2 in which there is little unwanted radiation noise.

The method of transmitting the three bit information signals using the differential transmission line 2 is described in detail below using FIG. 4. FIG. 4 is a circuit diagram of the differential transmission circuit of FIG. 7. The differential driver IC1 is made of differential driver circuits 1a, 1b, and 1c, and the differential receiver IC3 is made of differential receiver circuits 3a, 3b, and 3c, and terminal resistors Ra, Rb, and Rc.

In the differential driver IC1, the positive output terminal a1 of the differential driver circuit 1a is connected to the signal line 2a and its negative output terminal a2 is connected to the signal line 2b, the positive output terminal b1 of the differential driver circuit 1b is connected to the signal line 2b and its negative output terminal b2 is connected to the signal line 2c, and the positive output terminal c1 of the differential driver circuit 1c is connected to the signal line 2c and its negative output terminal c2 is connected to the signal line 2a. The differential driver circuits 1a, 1b, and 1c each drive an approximately 3.5 mA current, and generate a differential signal in response to the bit information signal that arrives at the differential driver IC1. More specifically, the differential driver circuit 1a generates differential signals in response to a first bit information signal that arrives at the differential driver IC1 in order to produce a potential difference between the signal lines 2a and 2b. For example, when the bit information signal is 0, then the differential driver circuit 1a outputs a negative potential signal from the positive output terminal a1 and outputs a positive potential signal from the negative output terminal a2, whereas when the bit information signal is 1, the differential driver circuit 1a outputs a positive potential signal from the positive output terminal a1 and outputs a negative potential signal from the negative output terminal a2. Similarly, the differential driver circuit 1b generates differential signals in response to a second bit information signal that arrives at the differential driver IC1 in order to produce a potential difference between the signal lines 2b and 2c, and the differential driver circuit 1c generates differential signals in response to a third bit information signal that arrives at the differential driver IC1 in order to produce a potential difference between the signal lines 2c and 2a. The differential transmission line 2 has an odd mode impedance of 50Ω, for example, between the signal lines 2a, 2b, and 2c. The signal lines 2a, 2b, and 2c have equal electrical properties and form equivalent transmission routes, and these three signal lines 2a, 2b, and 2c together effect the transmission of three bit information signals. The differential receiver IC3 is provided with a terminal resistor Ra that terminates the pair of signal lines 2a and 2b, a terminal resistor Rb that terminates the pair of signal lines 2b and 2c, and a terminal resistor Rc that terminates the pair of signal lines 2c and 2a. The terminal resistors Ra, Rb, and Rc each have a 100Ω resistance value, which is equivalent to the differential impedance, and an approximately 350 mV voltage (that is, an approximately +350 mV or an approximately −350 mV voltage) is generated at each end of the terminal resistors Ra, Rb, and Rc in accordance with the direction of the approximately 3.5 mA current that is driven by the differential driver circuits 1a, 1b, and 1c. The differential receiver circuit 3a determines the direction of the current flowing on the resistor Ra, and based on the result of this determination, decodes the first bit information signal that was transmitted and converts it to the CMOS level and outputs it. Similarly, the differential receiver circuit 3b determines the direction of the current flowing on the resistor Rb, and based on the result of this determination, decodes the second bit information signal that was transmitted and converts it to the CMOS level and outputs it, and the differential receiver circuit 3c determines the direction of the current flowing on the resistor Rc, and based on the result of this determination, decodes the third bit information signal that was transmitted and converts it to the CMOS level and outputs it.

When a bit information signal is transmitted over the differential transmission line 2, the differential receiver IC3 decodes the bit information signal before transmission as shown below.

Table 3 is a bit allocation table that shows the relationship between the bit information signals that are transmitted, and the potential (terminal potential) at the terminals of the signal lines 2a, 2b, and 2c on the side of the differential receiver circuits 3a, 3b, and 3c. The values of the terminal potentials have been normalized in order to simplify the description.

TABLE 3

| first bit information | second bit information | third bit information | terminal potential of signal line 2a | terminal potential of signal line 2b | terminal potential of signal line 2c |
|---|---|---|---|---|---|
| 0 | 0 | 0 | 0 | 0 | 0 |
| 0 | 0 | 1 | −1 | 0 | 1 |
| 0 | 1 | 0 | 0 | 1 | −1 |
| 0 | 1 | 1 | −1 | 1 | 0 |
| 1 | 0 | 0 | 1 | −1 | 0 |
| 1 | 0 | 1 | 0 | −1 | 1 |
| 1 | 1 | 0 | 1 | 0 | −1 |
| 1 | 1 | 1 | 0 | 0 | 0 |

Here, the terminal potentials of the signal lines 2a, 2b, and 2c are described. In one signal line, on its driver side, two voltage signals $V_1$ and $V_2$ that are generated by two differential driver circuits are superimposed and applied, and on its receiver side, the overall impedance Z of the receiver is charged. When r is the internal resistance of the signal line, the terminal potential V of the signal line is expressed by the following equation.

Eq. 5
$$V = \frac{V_1 + V_2}{r + 2Z} Z \quad (5)$$

Here, r can be considered significantly smaller than Z, and thus the equation can be approximated as follows.

Eq. 6
$$V = \frac{1}{2}(V_1 + V_2) \quad (6)$$

Table 4 shows the current direction of the terminal resistors Ra, Rb, and Rc.

TABLE 4

| first bit information | second bit information | third bit information | current direction at terminal resistor Ra | current direction at terminal resistor Rb | current direction at terminal resistor Rc |
|---|---|---|---|---|---|
| 0 | 0 | 1 | − | − | + |
| 0 | 1 | 0 | − | + | − |
| 0 | 1 | 1 | − | + | + |
| 1 | 0 | 0 | + | − | − |
| 1 | 0 | 1 | + | − | + |
| 1 | 1 | 0 | + | + | − |

In this way, the voltage that is applied to the signal lines 2a, 2b, and 2c of the differential transmission line 2 totals 0 regardless of the bit information signal that is transmitted, and noise that radiates from the signal lines 2a, 2b, and 2c cancels itself out, and thus transmission with little noise is possible.

It should be noted that the multiple differential transmission system that includes the differential transmission line according to this embodiment of the invention is the same as in the first embodiment and thus will not be described.

The above embodiment describes an odd mode impedance of the differential transmission line 2 of 50Ω and a differential impedance of 100Ω, but it is also possible to set the impedances to other values. The above embodiment describes an example in which three differential driver circuits 1a, 1b, and 1c are formed in the differential driver IC1, and three terminal resistors Ra, Rc, and Rc and three differential receiver circuits 3a, 3b, and 3c are formed in the differential receiver IC3, but the effects are the same when ICs in which a signal circuit is formed in a single IC are mounted onto a plurality of printer circuit boards 4. The above embodiment describes an example in which terminal resistors Ra, Rb, and Rc are formed in the differential receiver IC3, but the effects are the same even when the terminal resistors Ra, Rb, and Rc are mounted onto the printed circuit board 4 as external components. The above embodiment describes a case in which etching is used to form the pattern conductors 2ab, 2bb, and 2cb for the signal lines 2a, 2b, and 2c, but the same effects are achieved when printing is employed to create the pattern for the signal lines 2a, 2b, and 2c. The above embodiment describes an example in which only the pattern conductors 2ab, 2bb, and 2cb for the signal lines 2a, 2b, and 2c are formed in the conductor layers T2 and T3, but it is also possible to provide other circuit elements in the conductor layers T2 and T3 away from the differential transmission line 2 in such a manner that they do not affect it. The above embodiment describes LVDS as an example, but the same effects are achieved with other differential transmission methods as well.

With the differential transmission line 2 of this embodiment, in the differential transmission line, which has the three signal lines 2a, 2b, and 2c, the distances between the three signal lines 2a, 2b, and 2c and the differential impedance can be kept constant, and thus their electromagnetic fields cancel each other out and it is possible to achieve a multiple differential transmission system with low radiation noise. In particular, by having the cross-sectional shape of the three signal lines 2a, 2b, and 2c form an equilateral triangle, the differential transmission line 2 can be manufactured with ease using a conventional layering method.

Modified Example

Figure 9:
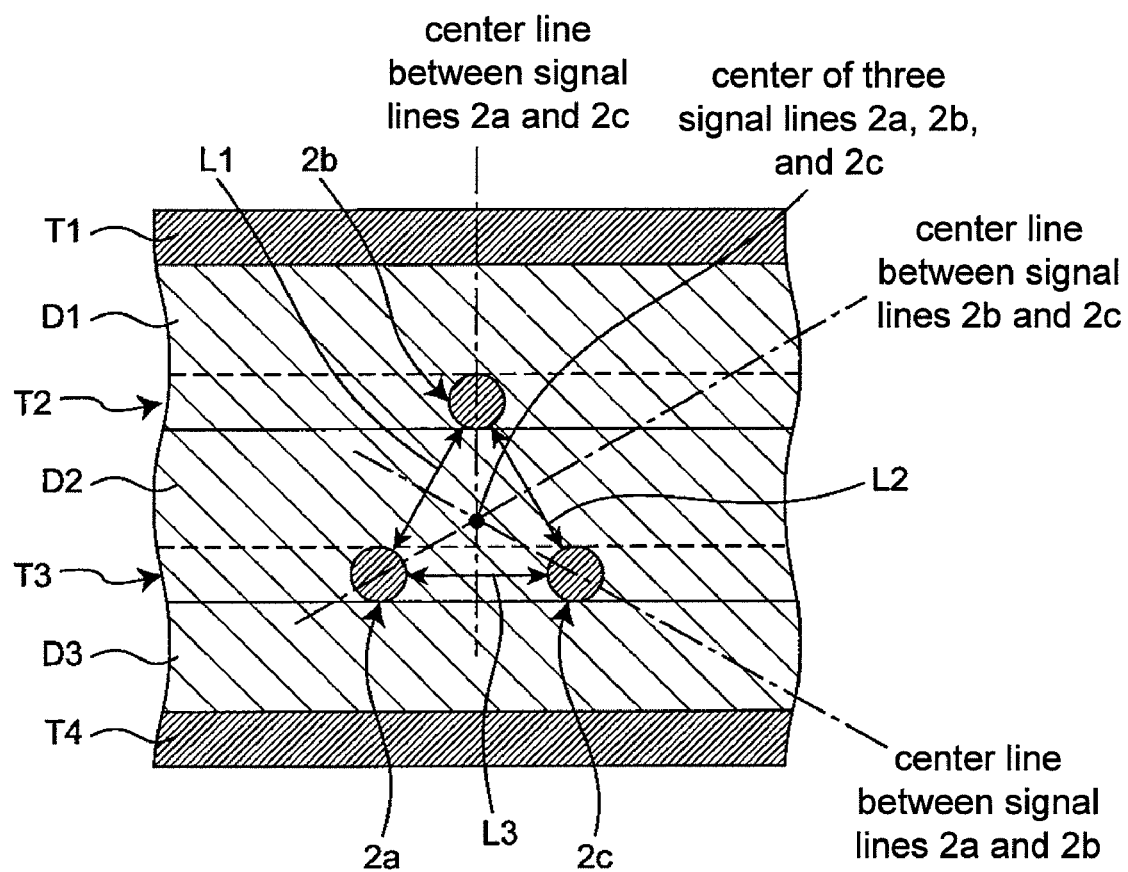
FIG. 9 is a cross-sectional view of the differential transmission circuit according to a first modified example of the third embodiment of the invention.

FIG. 9 is a cross-sectional diagram of the differential transmission circuit according to a first modified example of the third embodiment of the invention. In the embodiment described in FIG. 8, the cross-sectional shape of the signal lines 2a, 2b, and 2c was formed in a substantially equilateral triangle shape, but instead of this, in the modified example shown in FIG. 9 the cross-sectional shape of the signal lines 2a, 2b, and 2c is formed in a circular shape. In this case, like in the case of FIG. 8, in the section perpendicular to the longitudinal direction of the differential transmission line 2, the cross-sectional shape is such that a pair of two adjacent signal lines of the three signal lines 2a, 2b, and 2c is symmetrical about the central line between that pair of signal lines. The differences from the embodiment of FIG. 8 are described in detail below.

In the differential transmission line 2 of FIG. 9, the signal lines 2a, 2b, and 2c, which have a circular cross-sectional shape, are disposed symmetrical about the center of the three signal lines such that they are located at the apexes of an equilateral triangle. The signal lines 2a, 2b, and 2c of FIG. 9 are made from conductor lines that have a circular cross-sectional shape, and are adhered to and laid down upon the dielectric layers D3 and D2 during the course of manufacturing the printed circuit board 4, and other layers are layered upon them, such that the signal lines 2a, 2b, and 2c can be buried between layers as shown in FIG. 9. By disposing the three signal lines 2a, 2b, and 2c, whose cross-sectional shape is annular, in this way, it is possible to form a shape that is symmetrical about the center line between two adjacent signal lines. Thus, it is possible to dispose the three signal lines 2a, 2b, and 2c at a constant spacing, and the impedances between the signal lines can be made equal, and thus it is possible to achieve a differential transmission line in which there is little unwanted radiation noise.

It should be noted that in the above description, an example was illustrated in which conductor lines with an annular cross-sectional shape are adhered to and laid down on a dielectric layer to form signal lines 2a, 2b, and 2c, but the same effect is also achieved when these are formed by electroless plating, vacuum deposition, or another method.

Figure 10:
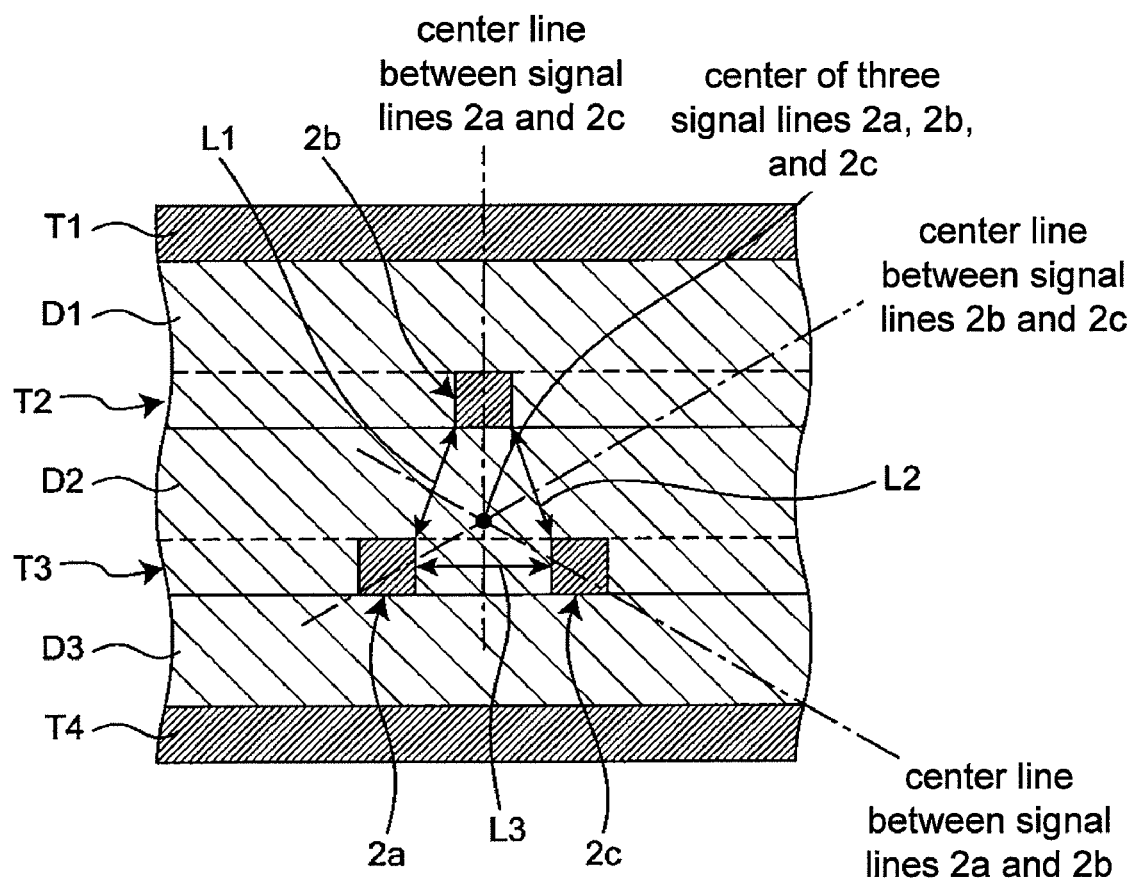
FIG. 10 is a cross-sectional view of the differential transmission circuit according to a second modified example of the third embodiment of the invention.

FIG. 10 is a cross-sectional diagram of the differential transmission line according to a second modified example of the third embodiment of the invention. The cross-sectional shape of the signal lines 2a, 2b, and 2c of the differential transmission line 2 is not limited to an equilateral triangle or a circle, and other polygonal shapes also are possible. In the modified example of FIG. 10, signal lines 2a, 2b, and 2c that have a square cross-sectional shape are disposed at an equal spacing on the same circumference, and thus this illustrates a case in which the signal lines are disposed symmetrically with respect to the center of the three signal lines such that they are positioned at the apexes of an equilateral triangle. The cross-sectional shape of the signal lines 2a, 2b, and 2c of FIG. 10 can be formed by etching a conducting material, like in the case of FIG. 8.

It should be noted that the examples shown in FIGS. 9 and 10 depicted signal lines 2a, 2b, and 2c with a circular or a square cross-sectional shape, but the same effects are obtained even when the cross-sectional shape is an oval, trapezoid, or other regular polygon, that is symmetrical about the center line between any pair of two adjacent signal lines.

Figure 11:
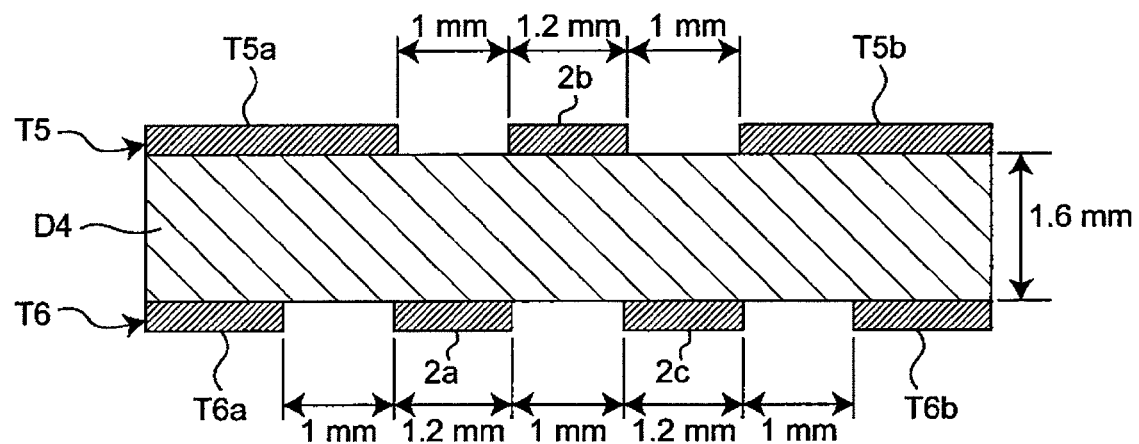
FIG. 11 is a cross-sectional view of the differential transmission circuit according to a third modified example of the third embodiment of the invention.

FIG. 11 is a cross-sectional diagram of a differential transmission circuit according to a third modified example of the third embodiment of the invention. The differential transmission line 2 of FIG. 11 is characterized in that it is formed as a coplanar line.

In FIG. 11, the board on which the differential transmission line 2 is provided is a double-sided printed circuit board provided with a dielectric layer D4, and conductor layers T5 and T6 provided above and below the dielectric layer D4. The conductor layer T5 is provided with a strip-shaped signal line 2b, and ground portions T5a and T5b of the conductor layer that are provided a predetermined distance to the left and right of the signal line 2b, and thus, the signal line 2b is formed as strip conductors of a coplanar line. The conductor layer T6 is provided with strip-shaped signal lines 2a and 2c, which are a predetermined distance from one another, a ground portion T6a of the conductor layer that is provided a predetermined distance to the left of the signal line 2a, and a ground portion T6b of the conductor layer that is provided a predetermined distance to the right of the signal line 2c, and thus, the signal lines 2a and 2c are each formed as strip conductors of a modified coplanar line (in this specification, this will be referred simply as "coplanar line"). The signal lines 2a, 2b, and 2c are disposed parallel to one another, and a cross section thereof shows that they are disposed substantially at the apexes of an equilateral triangle, like in FIG. 8, etc. The differential driver IC1 and the differential receiver IC3 both are provided in either the conductor layer T5 or T6, and at this time, the output terminals of the differential driver IC1 and the input terminals of the differential receiver IC3 are connected to the signal lines 2a, 2b, and 2c via the patterns of the conductor layers T5 and T6 and the through hole conductor that passes through the dielectric layer D4.

The dielectric layer D4 in FIG. 11 is formed by a FR-4 that for example has a dielectric constant ∈r of 4.7 and a thickness of 1.6 mm, and the conductor layers T5 and T6 are formed by copper foil 35 μm thick. The differential transmission line 2 can also be formed having the dimensions shown in FIG. 11.

The configuration of FIG. 11 allows the process of producing the differential transmission line 2 to be simplified compared to the configurations of FIGS. 8, 9, and 10.

Fourth Embodiment

Figure 12:
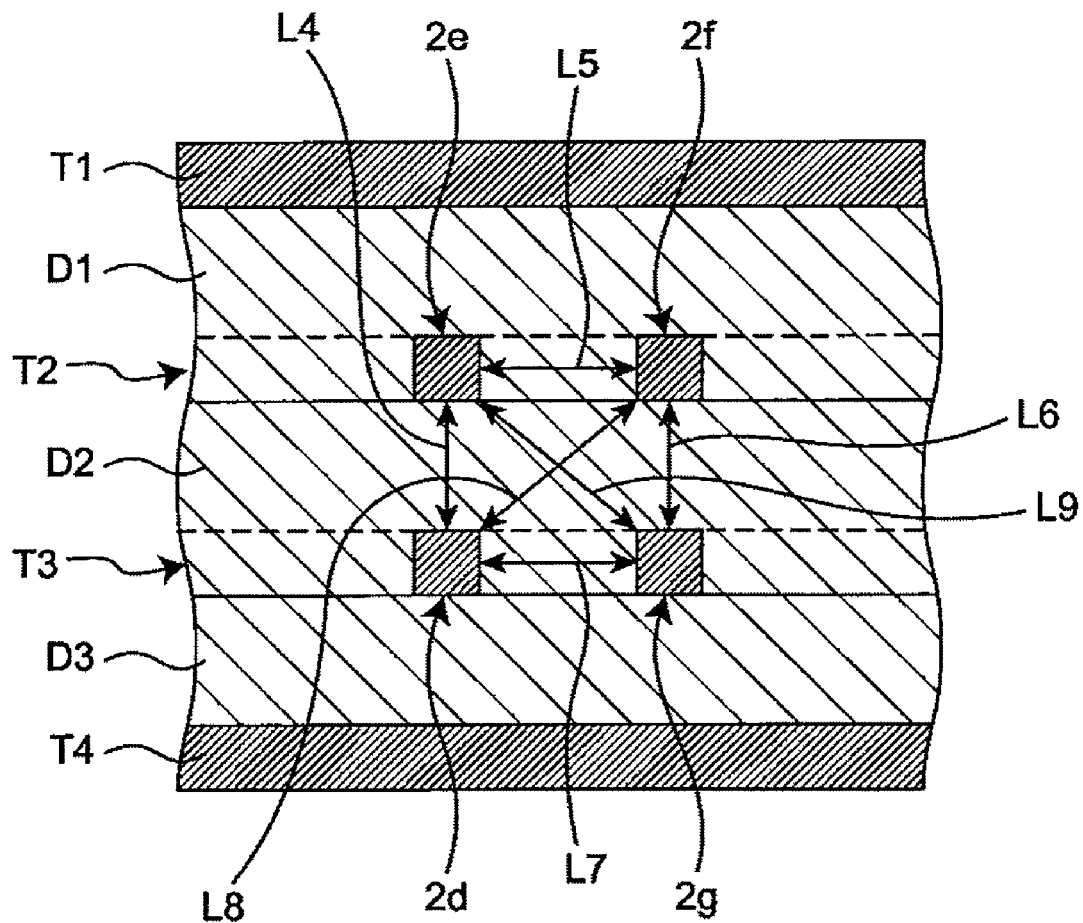
FIG. 12 is a cross-sectional view of the differential transmission circuit according to a fourth embodiment of the invention.

FIG. 12 is a cross-sectional view of a differential transmission line according to a fourth embodiment of the invention. The number of signal lines of the differential transmission line 2 is not limited to three lines, and it may also be provided with four or more signal lines. This embodiment is characterized in that four signal lines 2d, 2e, 2f, and 2g are disposed parallel to one another, and in a section perpendicular to the longitudinal direction of the differential transmission line 2, the four signal lines 2d, 2e, 2f, and 2g are disposed at substantially the same spacing on a same circumference, and thus are located at the apexes of a square. Moreover, in the section perpendicular to the longitudinal direction of the differential transmission line 2, each pair of adjacent signal lines of the four signal lines 2d, 2e, 2f, and 2g is symmetrical with respect to a center line between that pair of signal lines.

Thus, in the differential transmission line 2 of this embodiment, the distance L4 between the signal lines 2d and 2e, the distance L5 between the signal lines 2e and 2f, the distance L6 between the signal lines 2f and 2g, and the distance L7 between the signal lines 2g and 2d can be made equal (that is, the signal lines 2d, 2e, 2f, and 2g can be disposed at the same distance from one another), and the impedances between the signal lines can be made equal, and thus it is possible to achieve a differential transmission line 2 in which there is little unwanted radiation noise.

In this embodiment, the printed circuit board 4 can be a rigid board or a flexible board. Further, the structure of the board in the thickness direction is not limited to the structure that is shown, and the printed circuit board 4 can also be a multilayer board provided with more conductor layers and dielectric layers.

It should be noted that the specific configuration of the invention is not limited to the embodiments discussed above, and various modifications and alterations are possible within a scope that does not deviate from the gist of the invention.

The differential transmission line of the invention has three or more signal lines, and the distances from the output terminals of the differential driver IC to the signal line parallel segments can be made equal, and thus it can find utility as a differential transmission line in which there is little unwanted radiation noise.

What is claimed is:

1. A differential transmission line that is provided on a printed circuit board furnished with a plurality of laminated conductor layers, and that is furnished with at least three signal lines that transmit a differential signal from a driver unit on the printed circuit board to a receiver unit on the printed circuit board,
    wherein the at least three signal lines are provided in at least two conductor layers of the plurality of conductor layers, and
    wherein the signal lines comprise:
    (a) a signal line parallel segment in which the signal lines run parallel;
    (b) a first signal line route length adjustment segment, connecting from a differential signal output terminal in the driver unit to the signal line parallel segment, for adjusting the length of the signal line; and
    (c) a second signal line route length adjustment segment, connecting from the signal line parallel segment to a differential signal input terminal in the receiver unit, for adjusting the length of the signal line; and
    wherein the signal lines are formed such that they are equal in length to one another in the first signal line route length adjustment segment.

2. The differential transmission line according to claim 1, wherein the signal lines are formed such that they are equal in length to one another in the second signal line route length adjustment segment.

3. The differential transmission line according to claim 1, wherein the differential signal output terminals of the driver unit are disposed in the longitudinal direction of the signal lines such that the output terminal that is connected to the signal line that is provided in the conductor layer most removed from the driver unit is relatively closer from the receiver unit than the output terminals that are connected to the signal lines provided in other conductor layers.

4. The differential transmission line according to claim 3, wherein the differential transmission line is provided with three signal lines;
    wherein first and second signal lines of the three signal lines are provided in the first conductor layer of the plurality of conductor layers, separated from one another by a predetermined first distance; and
    wherein a third signal line of the three signal lines is provided in the second conductor layer of the plurality of conductor layers, separated from the first signal line and the second signal line by a predetermined second distance.

5. The differential transmission line according to claim 3, wherein the driver unit is provided with three output terminals for differential signals; and
    wherein the three output terminals are disposed parallel such that they are separated from one another by a predetermined same distance.

6. The differential transmission line according to claim 3, wherein at least some of the three signal lines are disposed parallel such that they are separated from one another by a predetermined same distance.

7. The differential transmission line according to claim 1, wherein the differential transmission line is provided with three signal lines;
    wherein the driver unit is provided with three output terminals for differential signals;
    wherein first and second signal lines of the three signal lines are provided in the first conductor layer of the plurality of conductor layers, separated from one another by a predetermined distance;
    wherein a third signal line of the three signal lines is provided in the second conductor layer of the plurality of conductor layers, separated from the first signal line and the second signal line by the predetermined distance; and
    wherein the three output terminals are disposed parallel such that the distance between the first and the second conductor layers is equal to the distance to a center point between the output terminal that is connected to the third signal line and the output terminals that are connected to the first and the second signal lines.

8. The differential transmission line according to claim 1, wherein the conductor layers in which are formed the signal lines other than the signal line that is provided in the conductor layer that is farthest removed from the driver unit include signal line return portions for extending the length of the other signal lines.

9. The differential transmission line according to claim 1, wherein the printed circuit board is provided with at least four laminated conductor layers, and
    two of the conductor layers are formed as ground conductors;
    wherein the signal lines are formed as pattern conductors in some of the at least two conductor layers that are not the ground conductors; and
    wherein all of the signal lines are disposed sandwiched by the two ground conductors.

10. A differential transmission line that is provided on a printed circuit board, and that is furnished with at least three signal lines that transmit a differential signal from a driver unit to a receiver unit,
    wherein the at least three signal lines are disposed parallel to one another; and
    wherein in a cross section that is perpendicular to a longitudinal direction of the differential transmission line, the at least three signal lines are disposed at a substantially equal spacing on a same circumference.

11. The differential transmission line according to claim 10,
    wherein in a cross section that is perpendicular to the longitudinal direction of the differential transmission line, each pair of two adjacent signal lines, of the three signal lines, has a cross-sectional shape that is symmetrical with respect to a center line between that pair of signal lines.

12. The differential transmission line according to claim 11,
wherein each signal line has a circular cross-sectional shape.

13. The differential transmission line according to claim 11,
wherein the differential transmission line comprises three signal lines; and
wherein each signal line has a substantially equilateral triangular cross-sectional shape.

14. The differential transmission line according to claim 10,
wherein the printed circuit board is a multilayer printed circuit board that includes at least four laminated conductor layers;
wherein two of the conductor layers serve as ground conductors;
wherein the signal lines are formed as pattern conductors in some of the at least two conductor layers that are not the ground conductors; and
wherein all of the signal lines are disposed sandwiched by the two ground conductors.

15. A differential transmission line that is provided on a double-sided printed circuit board, and that is furnished with at least three signal lines that transmit a differential signal from driver a unit to receiver a unit,
wherein one of the signal lines is formed as a strip conductor of a coplanar line in one of the conductor layers of the double-sided printed circuit board, and the other two signal lines are formed as strip conductors of a coplanar line in the other conductor layer of the double-sided printed circuit board;
wherein the three signal lines are disposed parallel to one another; and
wherein in a cross section that is perpendicular to the longitudinal direction of the differential transmission line, the three signal lines are disposed located substantially at the apexes of an equilateral triangle.

16. A differential transmission line according to claim 1, that is used in a multiple differential transmission system.

17. The differential transmission line according to claim 16,
wherein the multiple differential transmission system comprises a signal transmitter, and a signal receiver;
wherein
the signal transmitter:
is connected to the differential transmission line, which has first, second, and third signal lines; and
comprises:
a first differential driver that transmits a first output signal, and an inverted first output signal whose phase is inverted compared to the first output signal, in response to a first bit information signal;
a second differential driver that transmits a second output signal, and an inverted second output signal whose phase is inverted compared to the second output signal, in response to a second bit information signal; and
a third differential driver that transmits a third output signal, and an inverted third output signal whose phase is inverted compared to the third output signal, in response to a third bit information signal;
wherein the signal transmitter synthesizes the first output signal and the inverted third output signal and outputs the result to the first signal line, synthesizes the second output signal and the inverted first output signal and outputs the result to the second signal line, and synthesizes the third output signal and the inverted second output signal and outputs the result to the third signal line; and
wherein an absolute value of a binary signal voltage of the first output signal and an absolute value of a binary signal voltage of the second output signal are identical, and an absolute value of a binary signal voltage of the third output signal and the absolute value of the binary signal voltage of the first output signal are different; and
wherein
the signal receiver:
is connected to the differential transmission line, which has first, second, and third signal lines; and
comprises:
a first differential receiver that detects a polarity of a terminal voltage that occurs at a first terminal resistor that is connected between the first signal line and the second signal line, and outputs the result of this detection as the first bit information signal;
a second differential receiver that detects a polarity of a terminal voltage that occurs at a second terminal resistor that is connected between the second signal line and the third signal line, and outputs the result of this detection as the second bit information signal;
a third differential receiver that detects a polarity of a terminal voltage that occurs at a third terminal resistor that is connected between the third signal line and the first signal line, and outputs the result of this detection as the third bit information signal;
a comparison unit for determining whether or not the absolute value of the third terminal voltage that occurs at the third terminal resistor exceeds a predetermined threshold voltage; and
a control unit for outputting the first, second, and third bit information signals that are output from the first, second, and third differential receivers, when the absolute value of the third terminal voltage exceeds the predetermined threshold voltage, and outputs a 0 or 1 for all of the first, second, and third bit information signals, based on the third bit information signal that is output from the third differential receiver, when the absolute value of the third terminal voltage does not exceed the predetermined threshold voltage;
wherein the threshold voltage is set so that it is larger than the absolute value of the difference between the absolute value of the binary signal voltage of the first output signal and the absolute value of the binary signal voltage of the third output signal.

18. A differential transmission line according to claim 10, that is used in a multiple differential transmission system.

19. A differential transmission line according to claim 15, that is used in a multiple differential transmission system.

* * * * *